US010819932B2

(12) United States Patent
Takumi et al.

(10) Patent No.: US 10,819,932 B2
(45) Date of Patent: Oct. 27, 2020

(54) POSITION DETECTOR SENSOR

(71) Applicant: HAMAMATSU PHOTONICS K.K., Hamamatsu-shi, Shizuoka (JP)

(72) Inventors: Munenori Takumi, Hamamatsu (JP); Haruyoshi Toyoda, Hamamatsu (JP); Yoshinori Matsui, Hamamatsu (JP); Kazutaka Suzuki, Hamamatsu (JP); Kazuhiro Nakamura, Hamamatsu (JP); Keisuke Uchida, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 16/647,399

(22) PCT Filed: Aug. 21, 2018

(86) PCT No.: PCT/JP2018/030848
§ 371 (c)(1),
(2) Date: Mar. 13, 2020

(87) PCT Pub. No.: WO2019/058844
PCT Pub. Date: Mar. 28, 2019

(65) Prior Publication Data
US 2020/0213551 A1    Jul. 2, 2020

(30) Foreign Application Priority Data
Sep. 20, 2017  (JP) .................................. 2017-180094

(51) Int. Cl.
*H04N 5/3745*    (2011.01)
*G06T 7/66*    (2017.01)
(Continued)

(52) U.S. Cl.
CPC ........... *H04N 5/3745* (2013.01); *G01B 11/14* (2013.01); *G01J 1/0418* (2013.01); *G06T 7/66* (2017.01);
(Continued)

(58) Field of Classification Search
CPC ...... H04N 5/3545; H04N 5/232; H04N 5/335; G06T 7/66; G01B 11/14
(Continued)

(56) References Cited

U.S. PATENT DOCUMENTS 5,547,879 A    8/1996  Dierschke et al.
8,525,917 B2 *  9/2013  Taniguchi ................ G02B 7/34
                                           348/345
9,749,521 B2 *  8/2017  Li ....................... H04N 5/23212

FOREIGN PATENT DOCUMENTS

JP    S58-190710 A    11/1983
JP    S63-212832 A     9/1988
(Continued)

OTHER PUBLICATIONS

International Preliminary Report on Patentability dated Apr. 2, 2020 for PCT/JP2018/030848.

*Primary Examiner* — Hung Nguyen
(74) *Attorney, Agent, or Firm* — Faegre Drinker Biddle & Reath LLP

(57) ABSTRACT

In a first pixel part, as an incident position is closer to a first end of a first pixel pair group in a second direction, an intensity of a first electric signal decreases. In a second pixel part, as the incident position is closer to the first end, an intensity of a second electric signal increases. In a third pixel part, as the incident position is closer to a second end of a second pixel pair group in a first direction, an intensity of a third electric signal decreases. In a fourth pixel part, as the incident position is closer to the second end, an intensity of a fourth electric signal increases. A calculation unit performs
(Continued)

weighting on a first position on the basis of the third and fourth electric signals, and performs weighting on a second position on the basis of the first and second electric signals.

7 Claims, 19 Drawing Sheets

(51) Int. Cl.
    *G01B 11/14*     (2006.01)
    *G01J 1/04*     (2006.01)
    *H01L 27/146*     (2006.01)

(52) U.S. Cl.
    CPC .... *H01L 27/1462* (2013.01); *H01L 27/14603* (2013.01); *H01L 27/14609* (2013.01); *H01L 27/14623* (2013.01); *H01L 27/14643* (2013.01)

(58) Field of Classification Search
    USPC ........................................................ 356/615
    See application file for complete search history.

(56) References Cited

FOREIGN PATENT DOCUMENTS

| JP | S64-76781 A | 3/1989 |
|---|---|---|
| JP | H03-34369 A | 2/1991 |
| JP | 2005-218052 A | 8/2005 |
| WO | WO-2015/046045 A1 | 4/2015 |

\* cited by examiner (a)

(b)

POSITION DETECTOR SENSOR

TECHNICAL FIELD

The present disclosure relates to a position detection sensor

BACKGROUND ART

Patent Literature 1 discloses a light detection device that detects an incident light intensity distribution in each of two directions. The light detection device includes a light detection unit including first and second photodiodes at positions of pixels which are two-dimensionally arranged in M rows×N columns, a first signal processing unit that is electrically connected to N pieces of the first photodiodes located at an $m^{th}$ row, and a second signal processing unit that is electrically connected to M pieces of the second photodiodes located at an $n^{th}$ row. The first signal processing unit outputs a voltage value corresponding to the amount of charges transferred from the N pieces of first photodiodes located at the $m^{th}$ row. The second signal processing unit outputs a voltage value corresponding to the amount of charges transferred from the M pieces of second photodiodes located at the $n^{th}$ row. The light detection device acquires an incident light intensity distribution in a column direction by the voltage value output from the first signal processing unit, and acquires an incident light intensity distribution in a row direction by the voltage value output from the second signal processing unit.

CITATION LIST

Patent Literature

Patent Literature 1: Japanese Unexamined Patent Publication No. 2005-218052
Patent Literature 2: Japanese Unexamined Patent Publication No. H3-34369

SUMMARY OF INVENTION

Technical Problem

For example, as a position detection sensor capable of being used. for detecting a two-dimensional position to which light is incident in an optical control field, for example, a profile sensor (light detection device) disclosed in Patent Literature 1 can be exemplified. In the profile sensor, it is possible to calculate a two-dimensional position. to which light is incident on the basis of projection images (incident light intensity distributions) in two directions.

However, in the profile sensor, in a case where a plurality of light beams having the same luminance are simultaneously incident to the light detection unit, the following problem may occur. For example, in a case where two light beams having the same luminance are simultaneously incident to two corners on one diagonal line of the light detection unit, and in a case where the two light beams are simultaneously incident to two corners on the other diagonal line of the light detection unit, respective projection images may become the same. That is, a plurality of two-dimensional positions capable of being calculated on the basis of the projection images in two directions may exist. In this case, it is difficult to detect the two-dimensional positions to which the light beams are respectively incident with accuracy.

An object of the present disclosure is to provide a position detection sensor capable of detecting an incident position of each light beam even in a case where a plurality of light beams having the same luminance are simultaneously incident with accuracy.

Solution to Problem

According to an embodiment of the present disclosure, there is provided a position detection sensor that detects an incident position of light. The position detection sensor includes: a first pixel pair group including a plurality of first pixel pairs arranged along a first direction, each of the first pixel pairs that includes a first pixel part that generates a first electric signal corresponding to an incident light amount of the light and a second pixel part that is disposed side by side with the first pixel part in the first direction and generates a second electric signal corresponding to an incident light amount of the light; a second pixel pair group that includes a plurality of second pixel pairs arranged along a second. direction, each of the second pixel pairs including a third pixel part that generates a third electric signal corresponding to an incident light amount of the light and a fourth pixel part that is disposed side by side with the third pixel part in the second direction intersecting the first direction and generates a fourth electric signal corresponding to an incident light amount of the light, and the second pixel pair group intersecting the first pixel pair group; and a calculation unit that performs center-of-gravity operation by using the :first electric signal and the second electric signal to calculate a first position that is the incident position in the first direction, and performs center-of-gravity operation by using the third electric signal and the fourth electric signal to calculate a second position that is the incident position in the second direction. In the first pixel part, as the incident position is closer to a first end of the first pixel pair group in the second direction, an intensity of the first electric signal decreases. In the second pixel part, as the incident position is closer to the first end in the second direction, an intensity of the second electric signal increases. In the third pixel part, as the incident position is closer to a second end of the second pixel pair group in the first direction, an intensity of the third electric signal decreases. In the fourth pixel part, as the incident position is closer to the second end in the first direction, an intensity of the fourth electric signal increases. The calculation unit performs weighting on the first position on the basis of the intensity of the third electric signal and the intensity of the fourth electric signal, and performs weighting on the second position on the basis of the intensity of the first electric signal and. the intensity of the second electric signal.

In the position detection sensor, when light is incident to the first pixel part, the first pixel part generates the first electric signal (for example, a charge signal) corresponding to the incident light amount of the light. Similarly, when the light is incident to the second pixel part, the second pixel part generates the second electric signal (for example, a charge signal) corresponding to the incident light amount of the light. Since the plurality of first pixel pairs are arranged along the first direction, the calculation unit performs weighting operation (center-of-gravity operation) on positions of the first pixel part and the second pixel part with intensities of the first electric signal and the second electric signal to calculate the first position that is the incident position of the light in the first direction. When the light is incident to the third pixel part, the third pixel part generates the third electric signal (for example, a charge signal)

corresponding to the incident light amount of the light. Similarly, when the light is incident to the fourth pixel part, the fourth pixel part generates the fourth electric signal (for example, a charge signal) corresponding to the incident light amount of the light. Since the plurality of second pixel pairs are arranged along the second direction, the calculation unit performs weighting operation on the positions of the third pixel part and the fourth pixel part with intensities of the third electric signal and the fourth electric signal to calculate the second position that is the incident position of the light in the second direction. In addition, the calculation unit performs weighting on the first position on the basis of the intensities of the third electric signal and the fourth electric signal by using a variation of the intensities of the third electric signal and the fourth electric signal with respect to the incident position of the light in the first direction. In addition, the calculation unit performs weighting on the second position on the basis of the intensities of the first electric signal and the second electric signal by using a variation of the intensities of the first electric signal and the second electric signal with respect to the incident position of the light in the second direction. According to this, even in a case where a plurality of light beams having the same luminance are simultaneously incident to a light-receiving unit, it is possible to discriminate the first position and the second position each of the light beams on the basis of a difference in weighting on the first position and the second position. As a result, it is possible to detect the first position and the second position with respect to the incident positions of the light beams with accuracy.

In the position detection sensor, the first pixel pair group may further include a first transmission filter which covers the first pixel part and through which the light is transmitted, and a second transmission filter which covers the second pixel part and through Which the light is transmitted, the second pixel pair group may further include a third transmission filter which covers the third pixel part and through which the light is transmitted, and a fourth transmission filter which covers the fourth pixel part and through which the light is transmitted, a transmittance of the light in the first transmission filter may decrease as it is closer to the first end in the second direction, a transmittance of the light in the second transmission filter may increase as it is closer to the first end in the second direction, a transmittance of the light in the third transmission filter may decrease as it is closer to the second end in the first direction, and a transmittance of the light in the fourth transmission filter may increase as it is closer to the second end in the first direction. When first pixel pair group includes the first transmission filter and the second transmission filter, the following operation is obtained. Specifically, in the first pixel part, as the incident position is closer to the first end in the second direction, the incident light amount of the light that is incident to the first pixel part decreases, and according to this, the intensity of the first electric signal generated in the first pixel part also decreases. In contrast, in the second pixel part, as the incident position is closer to the first end in the second. direction, the incident light amount of the light that is incident to the second pixel part increases, and according to this, the intensity of the second electric signal generated in the second pixel part also increases. Accordingly, according to this configuration, it is possible to appropriately realize the first pixel pair group of the position detection sensor. In addition, when the second pixel pair group includes the third transmission filter and the fourth transmission filter, the following operation is obtained. Specifically, in the third pixel part, as the incident position is closer to the second end in the first direction, the incident light amount of the light that is incident to the third pixel part decreases, and according to this, the intensity of the third electric signal generated in the third pixel part also decreases. In contrast, in the fourth pixel part, as the incident position is closer to the second end in the first direction, the incident light amount of the light that is incident to the fourth pixel part increases, and according to this, the intensity of the fourth electric signal generated in the forth pixel part also increases. Accordingly, according to this configuration, it is possible to appropriately realize the second pixel pair group of the position detection sensor.

In the position detection sensor, the first pixel pair group may further include a first light-shielding part that covers another portion of the first pixel part excluding one portion of the first pixel part and shields the and a second light-shielding part that covers another portion of the second pixel part excluding one portion of the second pixel part and shields the light, and the second pixel pair group may further include a third light-shielding part that covers another portion of the third pixel part excluding one portion of the third pixel part and shields the light, and a fourth light-shielding part that covers another portion of the fourth pixel part excluding one portion of the fourth pixel part and shields the light. A width of the one portion of the first pixel part in the first direction may decrease as it is closer to the first end in the second direction, a width of the one portion of the second pixel part in the first direction may increase as it is closer to the first end in the second direction, a width of the one portion of the third pixel part in the second direction may decrease as it is closer to the second end in the first direction, and a width of the one portion of the fourth pixel part in the second direction may increase as it is closer to the second end in the first direction. When the first pixel pair group includes the first light-shielding part arid the second light-shielding part, the following operation is obtained. Specifically, in the first pixel part, as the incident position is closer to the first end in the second direction, the incident light amount of the light that is incident to the first pixel part decreases, and according to this, the intensity of the first electric signal generated in the first pixel part also decreases. In contrast, in the second pixel part, as the incident position is closer to the first end in the second direction, the incident light amount of the light that is incident to the second pixel part increases, and according to this, the intensity of the second electric signal generated in the second pixel part also increases. Accordingly, according to this configuration, it is possible to appropriately realize the first pixel pair group of the position detection sensor. In addition, when the second pixel pair group includes the third light-shielding part and the fourth light-shielding part, the following operation is obtained. Specifically, in the third pixel part, as the incident position is closer to the second end in the first direction, the incident light amount of the light that is incident to the third pixel part decreases, and according to this, the intensity of the third electric signal generated in the third pixel part also decreases. In contrast, in the fourth pixel part, as the incident position is closer to the second end in the first direction, the incident light amount of the light that is incident to the fourth pixel part increases, and according to this, the intensity of the fourth electric signal generated in the fourth pixel part also increases. Accordingly, according to this configuration, it is possible to appropriately realize the second pixel pair group of the position detection sensor.

In the position detection sensor, a width of the first pixel part in the first direction may decrease as it is closer to the first end in the second direction, a width of the second pixel part in the first direction may increase as it is closer to the first end in the second direction, a width of the third pixel part in the second direction may decrease as it is closer to the second end in the first direction, and a width of the fourth pixel part in the second direction may increase as it is closer to the second end in the first direction. When the first pixel pair group includes the first pixel part and the second pixel part, the following operation is obtained. Specifically, in the first pixel part, as the incident position is closer to the first end in the second direction, the incident light amount of the light that is incident to the first pixel part decreases, and according to this, the intensity of the first electric signal generated in the first pixel part also decreases. In contrast, in the second pixel part, as the incident position is closer to the first end in the second direction, the incident light amount of the light that is incident to the second pixel part increases, and according to this, the intensity of the second electric signal generated in the second pixel part also increases. Accordingly, according to this configuration, it is possible to appropriately realize the first pixel pair group of the position detection sensor. In addition, when the second pixel pair group includes the third pixel part and the fourth pixel part, the following operation is obtained. Specifically, in the third pixel part, as the incident position is closer to the second end in the first direction, the incident light amount of the light that is incident to the third pixel part decreases, and according to this, the intensity of the third electric signal generated in the third pixel part also decreases. In contrast, in the fourth pixel part, as the incident position is closer to the second end in the first direction, the incident light amount of the light that is incident to the fourth pixel part increases, and according to this, the intensity of the fourth electric signal generated in the fourth pixel part also increases. Accordingly, according to this configuration, it is possible to appropriately realize the second pixel pair group of the position detection sensor.

In the position detection sensor, the first pixel part may include a plurality of first pixels arranged along the second direction, the second pixel part may include a plurality of second pixels arranged along the second direction, the third pixel part may include a plurality of third pixels arranged along the first direction, the fourth pixel part includes a plurality of fourth pixels arranged along the first direction. A width of the first pixels in the first direction may be smaller as the first pixels are closer to the first end in the second direction, a width of the second pixels in the first direction may be larger as the second pixels are closer to the first end in the second direction, a width of the third pixels in the second direction may be smaller as the third pixels are closer to the second end in the first direction, and a width of the fourth pixels in the second direction may be larger as the fourth pixels are closer to the second end in the first direction. When the first pixel pair group includes the first pixel part and the second pixel part, the following operation is obtained. Specifically, in the first pixel part, as the incident position is closer to the first end in the second direction, the incident light amount of the light that is incident to the first pixel part decreases, and according to this, the intensity of the first electric signal generated in the first pixel part also decreases. In contrast, in the second pixel part, as the incident position is closer to the first end in the second direction, the incident light amount of the light that is incident to the second pixel part increases, and according to this, the intensity of the second electric signal generated in the second pixel part also increases. Accordingly, according to this configuration, it is possible to appropriately realize the first pixel pair group of the position detection sensor. In addition, when the second pixel pair group includes the third pixel part and the fourth pixel part, the following operation is obtained. Specifically, in the third pixel part, as the incident position is closer to the second end in the first direction, the incident light amount of the light that is incident to the third pixel part decreases, and according to this, the intensity of the third electric signal generated in the third pixel part also decreases. In contrast, in the fourth pixel part, as the incident position is closer to the second end in the first direction, the incident light amount of the light that is incident to the fourth pixel part decreases, and according to this, the intensity of the fourth electric signal generated in the fourth pixel part also increases. Accordingly, according to this configuration, it is possible to appropriately realize the second pixel pair group of the position detection sensor.

In the position detection sensor, the first pixel part may include a plurality of first pixels arranged along the second direction, the second pixel part may include a plurality of second pixels arranged along the second direction, the third pixel part may include a plurality of third pixels arranged along the first direction, the fourth pixel part may include a plurality of fourth pixels arranged along the first direction, the first pixel part may include a plurality of first amplifiers which are electrically connected to the plurality of first pixels and amplify intensities of electric signals generated in the plurality of first pixels, the second pixel part may include a plurality of second amplifiers which are electrically connected to the plurality of second pixels, and amplify intensities of electric signals generated in the plurality of second pixels, the third pixel part may include a plurality of third amplifiers which are electrically connected to the plurality of third pixels, and amplify intensities of electric signals generated in the plurality of third pixels, and the fourth pixel part may include a plurality of fourth amplifiers which are electrically connected to the plurality of fourth pixels, and amplify intensities of electric signals generated in the plurality of fourth pixels. An amplification rate of the first amplifiers may be smaller as the first pixels electrically connected to the first amplifiers are closer to the first end in the second direction, an amplification rate of the second amplifiers may be larger as the second pixels electrically connected to the second amplifiers are closer to the first end in the second direction, an amplification rate of the third amplifiers may be smaller as the third pixels electrically connected to the third amplifiers are closer to the second end in the first direction, and an amplification rate of the fourth amplifiers may be larger as the fourth pixels electrically connected to the fourth amplifiers are closer to the second end in the first direction. When the first pixel pair group includes the first amplifiers and the second amplifiers, in the first pixel part, as the incident position is closer to the first end in the second direction, the intensity of the first electric signal output from the first pixel part decreases. In contrast, in the second pixel part, as the incident position is closer to the first end in the second direction, the intensity of the second electric signal output from the second pixel part increases. According to the configuration, it is possible to appropriately realize the first pixel pair group of the position detection sensor. In addition, when the second pixel pair group includes the third amplifiers and the fourth amplifiers, in the third pixel part, as the incident position is closer to the second end in the first direction, the intensity of the third electric signal output from the third pixel part is decreases. In contrast, in the fourth pixel part, as the incident position is closer to the second end in the first direction, the intensity of the fourth electric signal output from the fourth pixel part increases. Accordingly, according to the configuration, it is possible to appropriately realize the second pixel pair group of the position detection sensor.

According to another embodiment of the present disclosure, there is provided a position detection sensor that detects an incident position of light. The position detection sensor includes: a first pixel group that includes a plurality of first pixel parts which are arranged along a first direction and generate a first electric signal corresponding to an incident light amount of the light; a second pixel group that includes a plurality of second pixel parts which are arranged along a second direction intersecting the first direction and generate a second electric signal corresponding, to an incident light amount of the light, the second pixel group intersecting the first pixel group; and a calculation unit that performs center-of-gravity operation by using the first electric signal to calculate a first position that is the incident position in the first direction, and performs center-of-gravity operation by using the second electric signal and the fourth electric signal to calculate a second position that is the incident position in the second direction. In the first pixel part, as the incident position is closer to a first end of the first pixel group in the second direction, an intensity of the first electric signal decreases. In the second pixel part, as the incident position is closer to a second end of the second pixel group in the first direction, an intensity of the second electric signal decreases. The calculation unit performs weighting on the first position by using the intensity of the second electric signal, and performs weighting on the second position by using the intensity of the first electric signal. Even in this embodiment, the same effect as described above can be obtained.

Advantageous Effects of Invention

According to the present disclosure, even in a case where a plurality of light beams having the same luminance are simultaneously incident, it is possible to detect an incident position of each of the light beams with accuracy.

DESCRIPTION OF EMBODIMENTS

Figure 1:
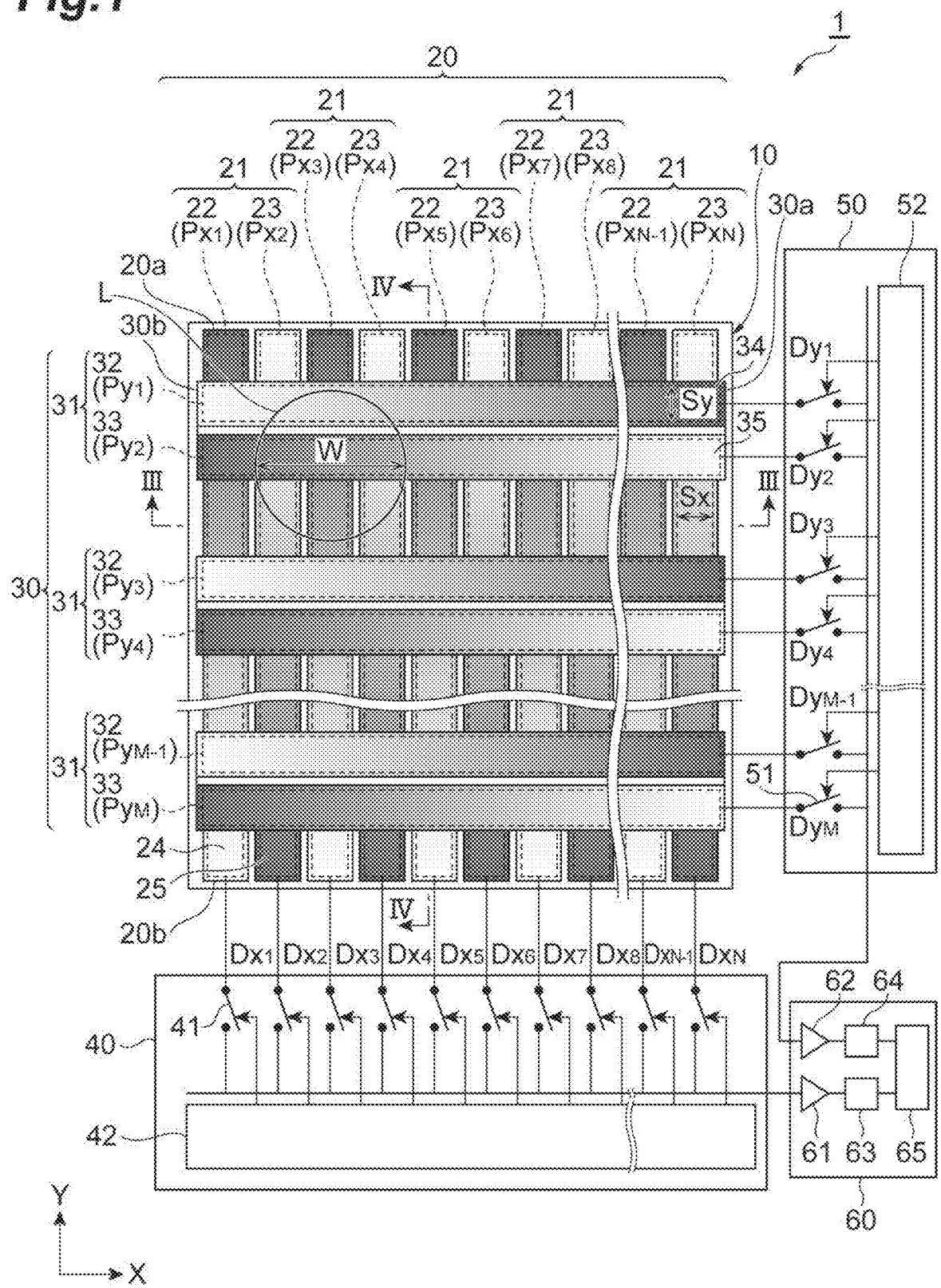
FIG. 1 is a schematic configuration diagram of a position detection sensor of an embodiment.

Hereinafter, an embodiment of a position detection sensor of the present disclosure will be described in detail with reference to the accompanying drawings. In description of the drawings, the same reference numeral will be given to the same element, and redundant description will be appropriately omitted.

Embodiment

FIG. 1 is a schematic configuration diagram illustrating a position detection sensor 1 of this embodiment. The position detection. sensor 1 is a sensor that detects a two-dimensional position with respect to an incident position of an incident light spot L, and examples thereof include a profile sensor. Specifically, the position detection sensor 1 detects a first detection position (first position) that is an incident position of the light spot L in an X-axis direction (first direction), and a second detection position (second position) that is an incident position. of the light spot L in a Y-axis direction (second direction) that interests the X-axis direction. As illustrated in FIG. 1, the position detection sensor 1 includes a light-receiving unit 10, a first signal processing unit 40, a second signal processing unit 50, and an operation processing unit 60.

The light-receiving unit 10 includes a first pixel pair group 20 and a second pixel pair group 30. The first pixel pair group 20 includes a plurality of first pixel pairs 21 which are arranged along the X-axis direction in an XY plane. Each of the plurality of first pixel pairs 21 includes a first pixel part 22 and a second pixel part 23 which are arranged side by side in the X-axis direction. For example, the first pixel part 22 and the second pixel part 23 have a rectangular shape in which the Y-axis direction is set as a longitudinal direction, and are alternately aligned along the X-axis direction. Hereinafter, a plurality of the first pixel parts 22 and a plurality of the second pixel parts 23 are collectively referred to as a plurality of pixel parts $Px_1$ to $Px_N$ (N is an integer of two or greater, and represents the number of pixels of the first pixel pair group 20).

In this embodiment, the pixel parts $Px_1$, $Px_3$, ..., and $Px_{N-1}$ assigned with odd numbers correspond to the first pixel parts 22, and the pixel parts $Px_2$, $Px_4$, ..., and $Px_N$ assigned with even numbers respectively correspond to the second pixel parts 23. The pixel parts $Px_1$, to $Px_N$ respectively generate charge signals $Dx_1$ to $Dx_N$ corresponding to an incident light amount of the incident light spot L. Specifically, when the light spot L is incident to the first pixel parts 22, the first pixel parts 22 generate charge signals $Dx_1$, $Dx_3$, ..., and $Dx_{N-1}$ (first electric signals) corresponding to an incident light amount of the light spot L. Similarly, when the light spot L is incident to the second pixel parts 23, the second pixel parts 23 generate charge signals $Dx_2$, $Dx_4$, ..., and $Dx_N$ (second electric signals) corresponding to an incident light amount of the light spot L.

The second pixel pair group 30 intersects the first pixel pair group 20 and is disposed on the first pixel pair group 20. The second pixel pair group 30 includes a plurality of second pixel pairs 31 which are arranged (for example, intermittently arranged) along the Y-axis direction in the XV plane. Each of the plurality of second pixel pairs 31 includes a third pixel part 32 and a fourth pixel part 33 which are arranged side by side in the Y-axis direction. For example, the third. pixel part 32 and the fourth pixel part 33 have a rectangular shape in which the Y-axis direction is set as a longitudinal direction, and are alternately aligned along the Y-axis direction. Hereinafter, a plurality of the third pixel parts 32 and a plurality of the fourth pixel parts 33 are collectively referred to as a plurality of pixel parts $Py_1$ to $Py_M$ (M is an integer of two or greater, and represents the number of pixels of the second pixel pair group 30). As a method of arranging the second pixel pair group 30 on the first pixel pair group 20, a method of laminating a substrate including the second pixel pair group 30 and a substrate including the first pixel pair group 20 is considered.

In this embodiment, the pixel parts $Py_1$, $Py_3$, ..., and $Py_{M-1}$ assigned with odd numbers correspond to the third pixel parts 32, and the pixel parts $Py_2$, $Py_4$, ..., and $Py_M$ assigned with even numbers respectively correspond to the fourth pixel parts 33. The pixel parts $Py_1$ to $Py_M$ respectively generate charge signals $Dy_1$ to $Dy_M$ corresponding to an incident light amount of the incident light spot L. Specifically, When the light spot L is incident to the third pixel parts 32, the third pixel parts 32 generate charge signals $Dy_1$, $Dy_3$, ..., and $Dy_{M-1}$ (third electric signals) corresponding to an incident light amount of the light spot L. Similarly, when the light spot L is incident to the fourth pixel parts 33, the fourth pixel parts 33 generate charge signals $Dy_2$, $D_4$, ..., and $Dy_M$ (fourth electric signals) corresponding to an incident light amount of the light spot L.

A diameter W of the light spot L is set to be larger than the larger one between a width Sx of the plurality of pixel parts $Px_1$ to $Px_N$ and a width Sy of the plurality of pixel parts $Py_1$ to $Py_M$. A luminance distribution of the light spot L has a Gaussian distribution (that is, an intensity distribution that is strongest near the center and gradually weakens toward the periphery) expressed by the following Expression (1). In Expression (1), I represents the intensity of the light spot L, and r is a distance from the center of the light spot L. $\omega$ is the distance r when the intensity I becomes $1/e^2$, and is a radius of the light spot L having the Gaussian distribution. The diameter W of the light spot L is expressed by $2\omega$.

[Mathematical Formula 1]

$$I(r) = \exp\left(-2\frac{r^2}{\omega^2}\right) \quad (1)$$

Figure 2:
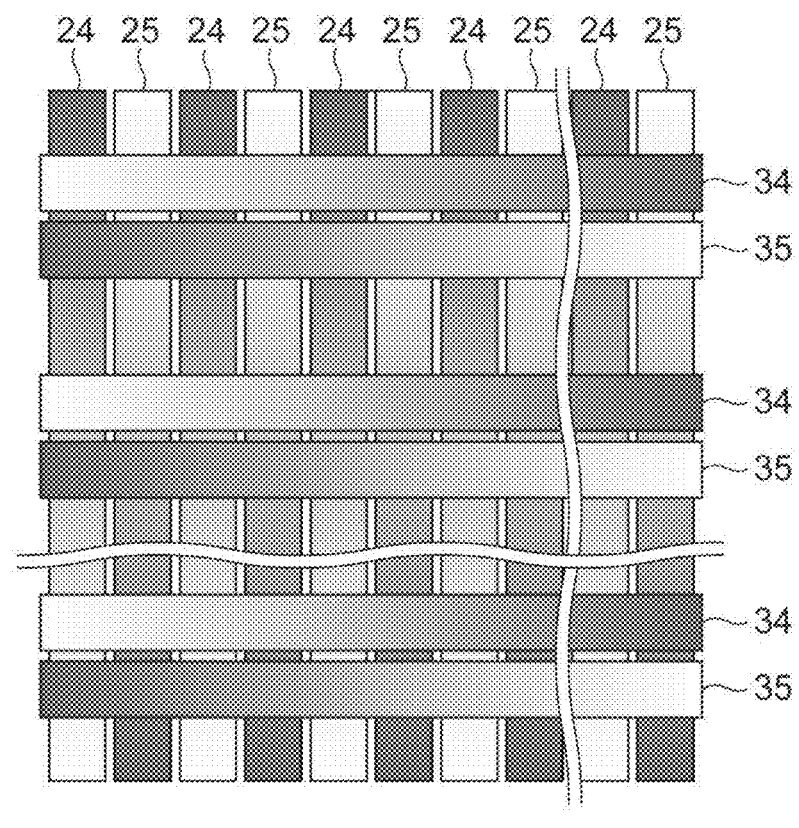
FIG. 2 is a top plan view illustrating a plurality of first transmission filters, a plurality of second transmission filters, a plurality of third transmission filters, and a plurality of fourth transmission filters.

The first pixel pair group 20 further includes a plurality of first transmission filters 24 which are respectively arranged on the plurality of first pixel parts 22, and a plurality of second transmission filters 25 which are respectively arranged on the plurality of second pixel parts 23. The second pixel pair group 30 further includes a plurality of third transmission filters 34 which are respectively arranged on the plurality of third pixel parts 32, and a plurality of fourth transmission filters 35 which are respectively arranged on the plurality of fourth pixel parts 33. The first transmission filters 24, the second transmission filters 25, the third transmission filters 34, and the fourth transmission filters 35 allow incident li F t to be transmitted therethrough. FIG. 2 is a top view illustrating the first transmission filters 24, the second transmission filters 25, the third transmission filters 34, and the fourth transmission filters 35. As illustrated in FIG. 2, for example, the first transmission filters 24 and the second transmission filters 5 have a rectangular shape in which the Y-axis direction is set as a longitudinal direction, and are alternately arranged along the X-axis direction. For example, the third transmission filter 34 and the fourth transmission filters 35 have a rectangular shape in which the X-axis direction is set as a longitudinal direction, and are alternately arranged along the Y-axis direction. In FIG. 1 and FIG. 2, a transmittance of the first transmission filter 24, the second transmission filter 25, the third transmission filter 34, and the fourth transmission filter 35 is expressed in shades of color. The smaller the transmittance is, the shades are darker, and the larger the transmittance is, the shades are thinner.

Figure 3:
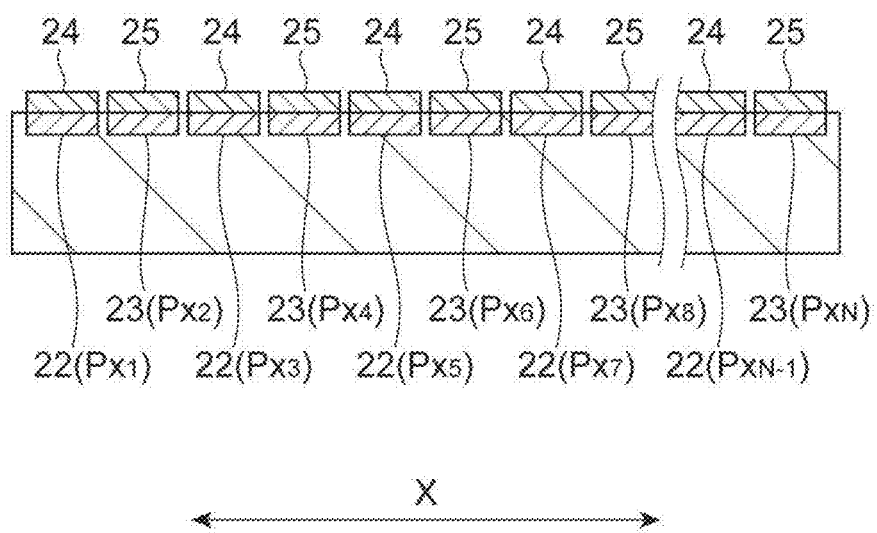
FIG. 3 is a cross-sectional view taken along line III-III in FIG. 1.
Figure 4:
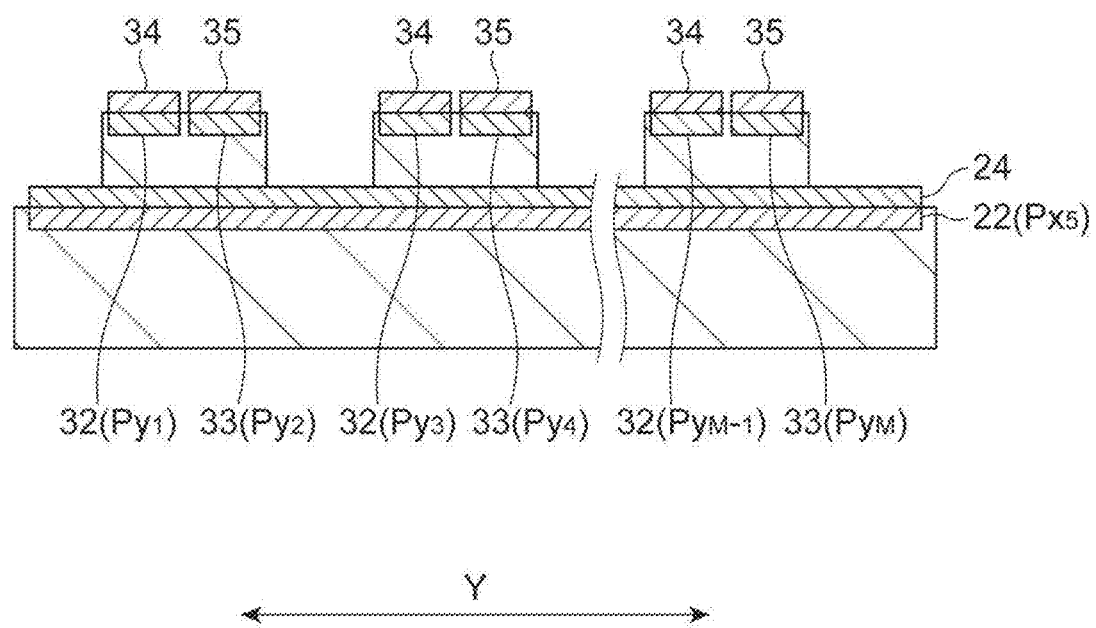
FIG. 4 is a cross-sectional view taken along line IV-IV in FIG. 1.

FIG. 3 is a cross-sectional view taken along line III-III illustrated in FIG 1. As illustrated in FIG. 3, the first transmission filters 24 respectively cover the first pixel parts 22, and the second transmission filters 25 respectively cover the second pixel parts 23. FIG. 4 is a cross-sectional view taken along line IV-IV illustrated in FIG 1. As illustrated in FIG. 4, the third transmission filters 34 respectively cover the third pixel parts 32, and the fourth transmission filters 35 respectively cover the fourth pixel parts 33. FIG. 1 will be referred to again. The transmittance of the first transmission filters 24 gradually decreases (that is, decreases in a monotone manner) as it is closer to one end 20a (first end) of the first pixel pair group 20 in the Y-axis direction, and gradually increases (that is, increases in a monotone manner) as it is closer to the other end 20b of the first pixel pair group 20 in the Y-axis direction on the first pixel parts 22. The transmittance of the first transmission filters 24 may gradually decrease as it is closer to the one end 20a in the Y-axis direction, or may gradually increase as it is closer to the other end 20b in the Y-axis direction on the first pixel parts 22.

When light is transmitted through the first transmission filters 24, an incident light amount of the light spot L that is incident to the first pixel parts 22 gradually decreases (or decreases step by step) as an incident position of the light spot L is closer to the one end 20a in the Y-axis direction, and gradually increases (or increases step by step) as the incident position is closer to the other end 20b in the Y-axis direction. According to this, the intensity of the charge signals $Dx_1$, $Dx_3$, ..., and $Dx_{N-1}$ respectively generated in the first pixel parts 22 also gradually decreases (or decreases step by step) as the incident position is closer to the one end 20a in the Y-axis direction, and gradually increases (increases step by step) as the incident position is closer to the other end 20b in the Y-axis direction.

In contrast, the transmittance in the second transmission filters 25 gradually increases (or increases step by step) as it is closer to the one end 20a in the Y-axis direction, and gradually decreases (or decreases step by step) as the it is closer to the other end 20b in the Y-axis direction on the second pixel parts 23. When light is transmitted through the second transmission filters 25, an incident light amount of the light spot L that is incident to the second pixel parts 23 gradually increases (or increases step by step) as an incident position of the light spot L is closer to the one end 20a in the Y-axis direction, and gradually decreases (or decreases step by step) as the incident position is closer to the other end 20b in the Y-axis direction. According to this, the intensity of the charge signals $Dx_2, Dx_4, \ldots Dx_N$ respectively generated in the second pixel parts 23 also gradually increases (or increases step by step) as the incident position is closer to the one end 20a in the Y-axis direction, and gradually decreases (decreases step by step) as the incident position is closer to the other end 20b in the Y-axis direction. In this mariner, an increase direction or a decrease direction of the transmittance in the Y-axis direction is reversed between the first transmission filters 24 and the second transmission filters 25.

A transmittance of the third transmission filters 34 gradually decreases (or decreases step by step) as it is closer to one end 30a (second end) of the second pixel pair group 30 in the X-axis direction on the third pixel parts 32, and gradually increases (or increases step by step) as it is closer to the other end 30b of the second pixel pair group 30 in the X-axis direction. When light is transmitted through the third transmission filters 34, an incident light amount of the light spot L that is incident to the third pixel parts 32 gradually decreases (or decreases step by step) as an incident position of the light spot L is closer to the one end 30a in the X-axis direction, and gradually increases (or increases step by step) as the incident position of the light spot L is closer to the other end 30b in the X-axis direction. According to this, the intensity of the charge signals $Dy_1, Dy_3, \ldots Dy_{M-1}$ generated in the third pixel parts 32 also gradually decreases (or decreases step by step) as the incident position is closer to the one end 30a in the X-axis direction, and gradually increases (or increases step by step) as the incident position is closer to the other end 30b in the X-axis direction.

In contrast, a transmittance of the fourth transmission filters 35 gradually increases (or increases step by step) as it is closer to the one end 30a in the X-axis direction, and gradually decreases (or decreases step by step) as it is closer to the other end 30b in the X-axis direction on the fourth pixel parts 33. When light is transmitted through the fourth. transmission filters 35, an incident light amount of the light spot L that is incident to the fourth pixel parts 33 gradually increases (or increases step by step) as the incident position of the light spot L is closer to the one end 30a in the X-axis direction, and gradually decreases (or decreases step by step) as the incident position of the light spot L is closer to the other end 30b in the X-axis direction, According to this, the intensity of the charge signals $Dy_2, Dy_4, \ldots,$ and $Dy_M$ generated in the fourth pixel parts 33 also gradually increases (or increases step by step) as the incident position is closer to the one end 30a in the X-axis direction, and gradually decreases (or decreases step by step) as the incident position is closer to the other end 30b in the X-axis direction. In this manner, an increase direction or a decrease direction of the transmittance in the X-axis direction is reversed between the third transmission filters 34 and the fourth transmission filters 35.

The first signal processing unit 40 is disposed side by side with the light-receiving unit 10 in the Y-axis direction. The first signal processing unit 40 includes a plurality of switch elements 41 and a shift register 42. The switch elements 41 are provided in correspondence with the pixel parts $Px_1$ to $Px_N$. Input terminals of the switch elements 41 are electrically connected to the pixel parts $Px_1$ to $Px_N$. The shift register 42 is provided to sequentially read out the charge signals $Dx_1$ to $Dx_N$ from the pixel parts $Px_1$ to $Px_N$. The shift register 42 outputs a control signal for controlling an operation of the switch elements 41. The switch elements 41 are sequentially closed by the control signal output from the shift register 42. When the switch elements 41 are sequentially closed, the charge signals $Dx_1$ to $Dx_N$ generated in the pixel parts $Px_1$ to $Px_N$ are sequentially output from output terminals of the switch elements 41.

The second signal processing unit 50 is disposed side by side with the light-receiving unit 10 in the X-axis direction. The second signal processing unit 50 includes a plurality of switch elements 51 and a shift register 52. The switch elements 51 are provided in correspondence with the pixel parts $Py_1$ to $Py_M$. Input terminals of the switch elements 51 are electrically connected to the pixel parts $Py_1$ to $Py_M$. The shift register 52 is provided to sequentially read out the charge signals $Dy_1$ to $Dy_M$ from the pixel parts $Py_1$ to $Py_M$. The shift register 52 outputs a control signal for controlling an operation of the switch elements 51. The switch elements 51 are sequentially closed by the control signal output from the shift register 52. When the switch elements 51 are sequentially closed, the charge signals $Dy_1$ to $Dy_M$ generated in the pixel parts $Py_1$ to $Py_M$ are sequentially output from output terminals of the switch elements 51.

The operation processing unit 60 includes amplifiers 61 and 62, A/D converters 63 and 64, and a calculation unit 65. The amplifier 61 is electrically connected to the output terminals of the switch elements 41. The amplifier 61 outputs voltage values corresponding to the charge signals $Dx_1$ to $Dx_N$ output from the output terminals of the switch elements 41. The A/D converter 63 is electrically connected to the amplifier 61. The A/D converter 63 converts the voltage values output from the amplifier 61 into digital values. The AD converter 63 outputs the digital values. The digital values are values corresponding to intensities of the charge signals $Dx_1$ to $Dx_N$. Accordingly, hereinafter, description may be given in a state of substituting the digital values with the intensities of the charge signals $Dx_1$ to $Dx_N$.

On the other hand, the amplifier 62 is electrically connected to output terminals of the switch elements 51. The amplifier 62 outputs voltage values corresponding to the charge signals $Dy_1$ to $Dy_M$ output from the output terminals of the switch elements 51. The A/D converter 64 is electrically connected to the amplifier 62. The A/D converter 64 converts the voltage values output from the amplifier 62 into digital values. The A/D converter 64 outputs the digital values. The digital values are. values corresponding to intensities of the charge signals $Dy_1$ to $Dy_M$. Accordingly, hereinafter, description may be given in a state of substituting the digital values with the intensities of the charge signals $Dy_1$ to $Dy_M$.

The calculation unit 65 is electrically connected to the A/D converters 63 and 64. The calculation unit 65 receives the digital values output from the A/D converter 63 as time-series data. The time-series data represents a projection image (profile) in the X-axis direction. In addition, the calculation unit 65 receives the digital values output from the A/D converter 64 as time-series data. The time-series data represents a projection image in the Y-axis direction. The calculation unit 65 calculates a first detection position that is an incident position of the light spot L in the X-axis direction, and a second detection position that is an incident position of the light spot L in the Y-axis direction, respectively, on the basis of the projection image in the X-axis direction and the projection image in the Y-axis direction, that is, on the basis of the charge signals $Dx_1$ to $Dx_N$ and the charge signals $Dy_1$ to $Dy_M$ received from the A/D converters 63 and 64.

The calculation unit 65 calculates the first detection position as follows. Specifically, the calculation unit 65 calculates the first detection position by performing weighting operation (center-of-gravity operation) on positions of the pixel parts $Px_1$ to $Px_N$ in the X-axis direction. with the intensities of the charge signals $Dx_1$ to $Dx_N$. Specifically, the calculation unit 65 calculates the first detection position by using the following Expression (2) and Expression (3). PA1 represents the first detection position. In Expression (2), i represents 2, 3, . . . , or N-1, and in Expression (3), i represents 1, 2, . . . , or N.

[Mathematical Formula 2]

$$D'x_i = \left\{ Dx_i + \frac{Dx_{i-1} + Dx_{i+1}}{2} \right\} \quad (2)$$

[Mathematical Formula 3]

$$PA1 = \frac{\sum_{i=1}^{N} iD'x_i}{\sum_{i=1}^{N} D'x_i} \quad (3)$$

On the other hand, the calculation unit 65 calculates the second detection position as follows. Specifically, the calculation unit 65 calculates the second detection position by performing weighting operation on positions of the pixel parts $Py_1$ to $Py_M$ in the Y-axis direction with the intensities of the charge signals $Dy_1$ to $Dy_M$. Specifically, the calculation unit 65 calculates the second detection position by using the following Expression (4) and Expression (5). PB1 represents the second detection position. In Expression (4), i represents 2, 3, . . . , or M-1, and in Expression (5), i represents 1, 2, . . . , or M.

[Mathematical Formula 4]

$$D'y_i = \left\{ Dy_i + \frac{Dy_{i-1} + Dy_{i+1}}{2} \right\} \quad (4)$$

[Mathematical Formula 5]

$$PB1 = \frac{\sum_{i=1}^{M} iD'y_i}{\sum_{i=1}^{M} D'y_i} \quad (5)$$

In a case Where the diameter W of the light spot is larger than the larger one between the width Sx of the pixel parts $Px_1$ to $Px_N$ in the X-axis direction and the width Sy of the pixel parts $Py_1$ to $Py_N$ in the Y-axis direction, the calculation unit 65 can calculates the first detection position PA1 and the second detection position PB1 with sub-pixel unit accuracy.

In addition, the calculation unit 65 calculates first weighting information and second weighting information in addition to the first detection position PA1. and the second detection position PB1. The first weighting information is calculated on the basis of the intensities of the charge signals $Dx_1, Dx_3, \ldots,$ and $Dx_{N-1}$ generated in the first pixel parts 22, and the intensities of the charge signals $Dx_2, Dx_4, \ldots,$ and $Dx_N$ generated in the second pixel parts 23. For example, the first weighting information is calculated by taking a ratio between an integrated value of the intensities of the charge signals $Dx_1, Dx_3, \ldots,$ and $Dx_{N-1}$ generated in the first pixel parts 22, and an integrated value of the intensities of the charge signals $Dx_1$ to $Dx_N$ generated in all of the pixel parts $Px_1$ to $Px_N$ (that is, the first pixel parts 22 and the second pixel parts 23) of the first pixel pair group 20. In an example, the first weighting information is calculated by using the following Expression (6). PB2 represents the first weighting information, and j is 1, 2, . . . , or N/2. C (PA1, W) is a correction term based on the first detection position PA1 and the diameter W of the light spot. C (PA1, W) is a term that is added to obtain the first weighting information PB2 with accuracy in a case where the diameter W of the light spot is smaller than the width Sx of the pixel parts $Px_1$ to $Px_N$ in the X-axis direction, and the width Sy of the pixel parts $Py_1$ to $Py_M$ in the Y-axis direction, and is not essential.

[Mathematical Formula 6]

$$PB2 = \frac{\sum_{j=1}^{\frac{N}{2}} Dx_{2j}}{\sum_{j=1}^{\frac{N}{2}} \{Dx_{2j} + Dx_{2j-1}\}} + C(PA1, W) \quad (6)$$

As described above, the intensities of the charge signals $Dx_1, Dx_3, \ldots,$ and $Dx_{N-1}$ generated in the first pixel parts 22 decrease the incident position of the light spot L is closer to the one end 20a in the Y-axis direction, and the intensities of the charge signals $Dx_2, Dx_4, \ldots,$ and $Dx_N$ generated in the second pixel parts 23 increase as the incident position of the light spot L is closer to the one end 20a in the Y-axis direction. The calculation unit 65 performs weighting on the second detection position PB1 with the first weighting information PB2 by using a variation of the intensities of the charge signals $Dx_1$ to $Dx_N$ with respect to the incident position of the light spot L in the Y-axis direction.

The second weighting information is calculated on the basis of the intensities of the charge signals $Dy_1, Dy_3, \ldots,$ and $Dy_{M-1}$ generated in the third pixel parts 32, and the intensities of the charge signals $Dy_2, Dy_4, \ldots,$ and $Dy_M$ generated in the fourth pixel parts 33. For example, the second weighting information is calculated by taking a ratio between. an integrated value of the intensities of the charge signals $Dx_1, Dx_3, \ldots,$ and $Dx_{N-1}$ generated in the third pixel parts 32, and an integrated value of the intensities of the charge signals $Dy_1$ to $Dy_M$ generated in all of the pixel parts $Py_1$ to $Py_N$ (that is, the third pixel parts 32 and the fourth pixel parts 33) of the second pixel pair group 30. In an example, the second weighting information is calculated by using the following Expression (7). PA2 is the second weighting information, and j is 1, 2, . . . , or M/2. C (PB1, W) is a correction term based on the second detection position PB1 and the diameter W of the light spot. C (PB1, W) is a term that is added to obtain the second weighting information PA2 with accuracy in a case Where the diameter W of the light spot is smaller than the width Sx of the pixel parts $Px_1$ to $Px_N$ in the X-axis direction, and the width Sy of the pixel parts $Py_1$ to $Py_M$ in the Y-axis direction, and is not essential.

[Mathematical Formula 7]

$$PA2 = \frac{\sum_{j=1}^{\frac{M}{2}} Dy_{2j}}{\sum_{j=1}^{\frac{M}{2}} \{Dy_{2j} + Dy_{2j-1}\}} + C(PB1, W) \quad (7)$$

As described above, the intensities of the charge signals $Dy_1$, $Dy_3$, ..., and $Dy_{M-1}$ generated in the third pixel parts 32 decrease as the incident position of the light spot L is closer to the one end 30a in the X-axis direction, and the intensities of the charge signals $Dy_2$, $Dy_4$, ..., and $Dy_M$ generated in the fourth pixel parts 33 increase as the incident. position of the light spot L is closer to the one end 30a in the X-axis direction. In this manner, the intensities of the charge signals Dy1 to $Dy_M$ vary with respect to the incident position of the light spot L in the X-axis direction. The calculation unit 65 performs weighting on the first detection position PA1 with the second weighting information PA2 by using the variation of the charge signals $Dy_1$ to $Dy_M$.

Figure 18:
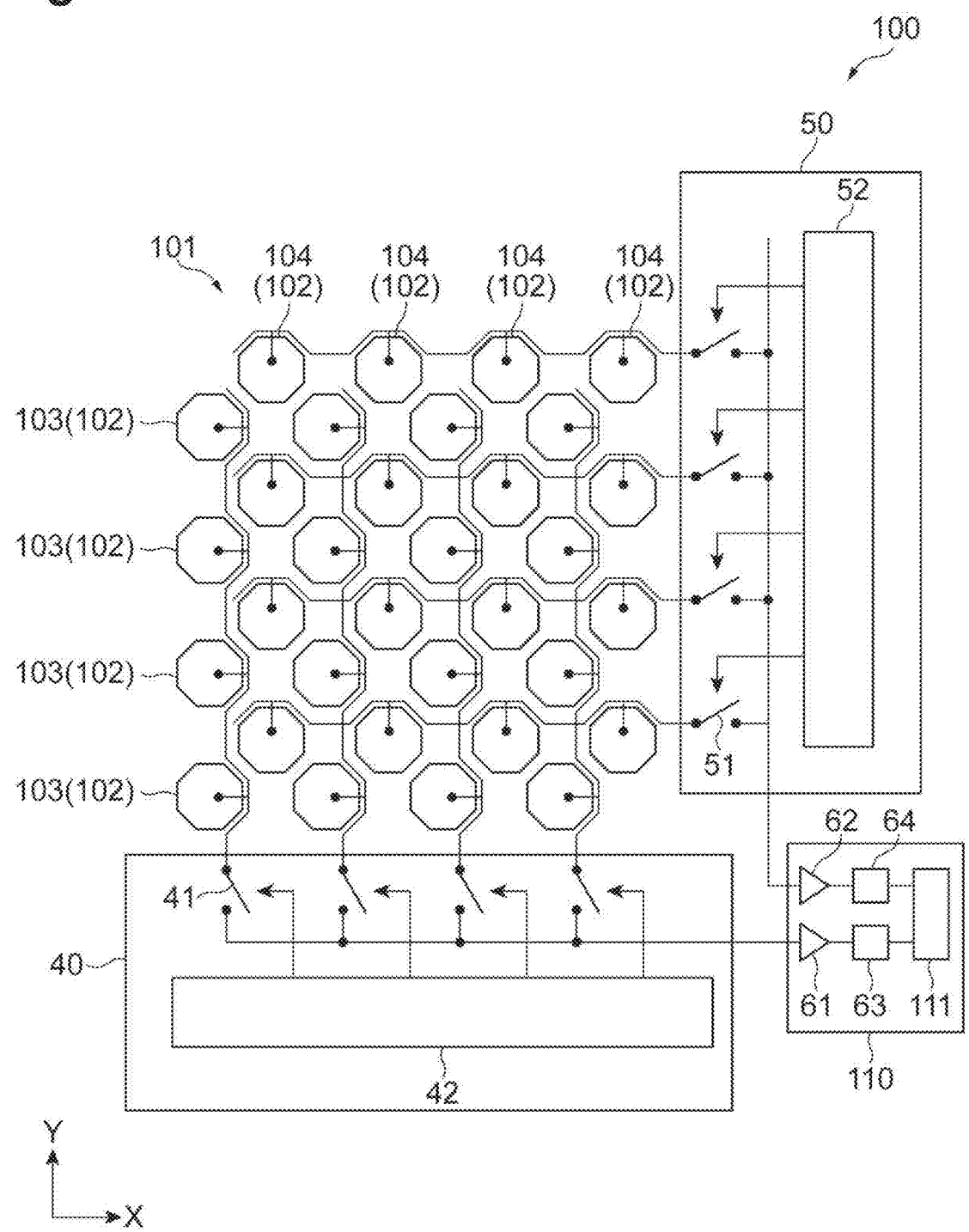
FIG. 18 is a schematic configuration diagram illustrating a profile sensor as a comparative example.

An effect obtained by the above-described position detection sensor 1 of this embodiment will be described together with a problem in a comparative example. For example, in a field of robot control or optical control, a profile sensor specialized for detecting a position of an incident light spot is suggested. For example, the profile sensor is applied to MEMS control application or the like. FIG. 18 is a view illustrating a profile sensor 100 as a comparative example. As illustrated in FIG. 18, the profile sensor 100 includes a light-receiving unit 101, the first signal processing unit 40, the second signal processing unit 50, and an operation processing unit 110. The profile sensor 100 and the position detection sensor 1 of this embodiment are different from each other in that the light-receiving unit 101 of this modification example includes a plurality of pixel parts 102 instead of the plurality of pixel parts $Px_1$ to $Px_N$ and $Py_1$ to $Py_M$, and the operation processing unit 110 of this modification example includes a calculation unit 111 instead of the calculation unit 65.

The plurality of pixel parts 102 are two-dimensionally arranged in the XY plane. Each of the pixel parts 102 are divided into two regions. A Y-axis direction pixel part 103 and an X-axis direction pixel part 104 are provided in the two regions of the pixel part 102, respectively. A plurality of the Y-axis direction pixel parts 103 are wired for every column (that is, in the Y-axis direction), and are electrically connected to the first signal processing unit 40. A plurality of the X-axis direction pixel parts 104 are wired for every row (that is, in the X-axis direction), and are electrically connected to the second signal processing unit 50. The first signal processing unit 40 reads out charge signals generated in the Y-axis direction pixel parts 103, and outputs the charge signals to the operation processing unit 110. The second signal processing unit 50 reads out charge signals generated in the X-axis direction pixel parts 104, and outputs the charge signals to the operation processing unit 110. The calculation unit 111 of the operation processing unit 110 acquires a projection image in the X-axis direction and a projection image in the Y-axis direction from the charge signals, and detects a first detection position and a second detection position on the basis of the projection images.

Figure 19:
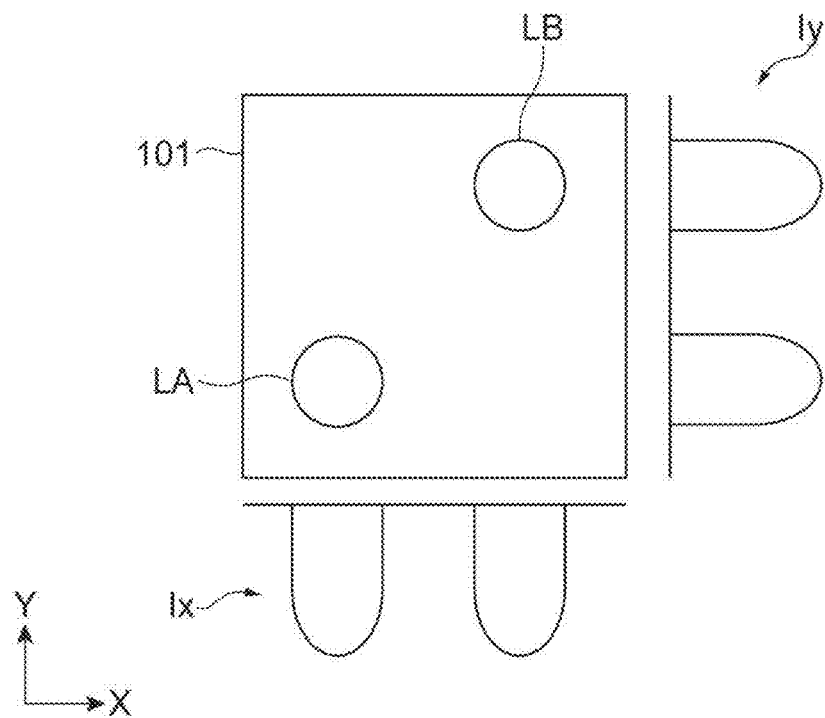
FIG. 19 is a view illustrating a problem in the profile sensor as the comparative example.
Figure 19:
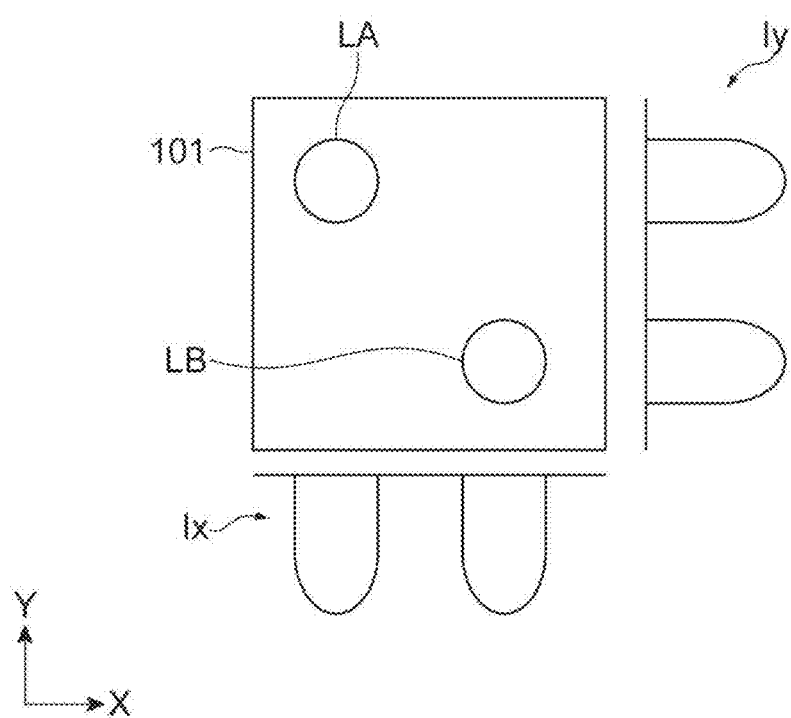

However, in the profile sensor 100, in a case where a plurality of light spots having the same luminance are simultaneously incident to the light-receiving unit 101, it is difficult to detect incident positions (that is, the first detection position and the second detection position) of the light spots with accuracy. FIG. 19 is a view illustrating a problem in the profile sensor 100. (a) of FIG. 19 illustrates a state in which two light spots LA and LB having the same luminance are simultaneously incident to two corners on one diagonal line of the light-receiving unit 101. (b) of FIG. 19 illustrates a state in which two light spots LA and LB having the same luminance are simultaneously incident to two corners on the other diagonal line of the light-receiving unit 101. In (a) and (b) of FIG. 19, a projection image Ix in the X-axis direction and a projection image Iy in the Y-axis direction in a case where the two light spots LA and LB are incident to respective positions of the light-receiving unit 101 are illustrated in combination.

As illustrated in (a) and (b) of FIG. 19, the projection image Ix in the X-axis direction and the projection image Iy in the Y-axis direction become the same between a case where the two light spots LA and LB are simultaneously incident to the two corners on the one diagonal line of the light-receiving unit 101, and a case where the two light spots LA and LB are simultaneously incident to the two corners on the other diagonal line of the light-receiving unit 101. That is, in this case, a plurality of incident positions (that is, the first detection position and the second detection position relating to each of the light spots LA and LB) capable of being calculated on the basis of the projection image Ix and Iy exist. That is, when the calculation unit 111 calculates an incident position on the basis of the projection image Ix and Iy, the incident position may be different from an actual incident position of the light spot LA and LB. Accordingly, in the profile sensor 100, in a case where a plurality of the light spots LA and LB having the same luminance are simultaneously incident to the light-receiving unit 101, there is a problem that it is difficult to detect the incident position of the light spot LA or LB with accuracy.

Figure 5:
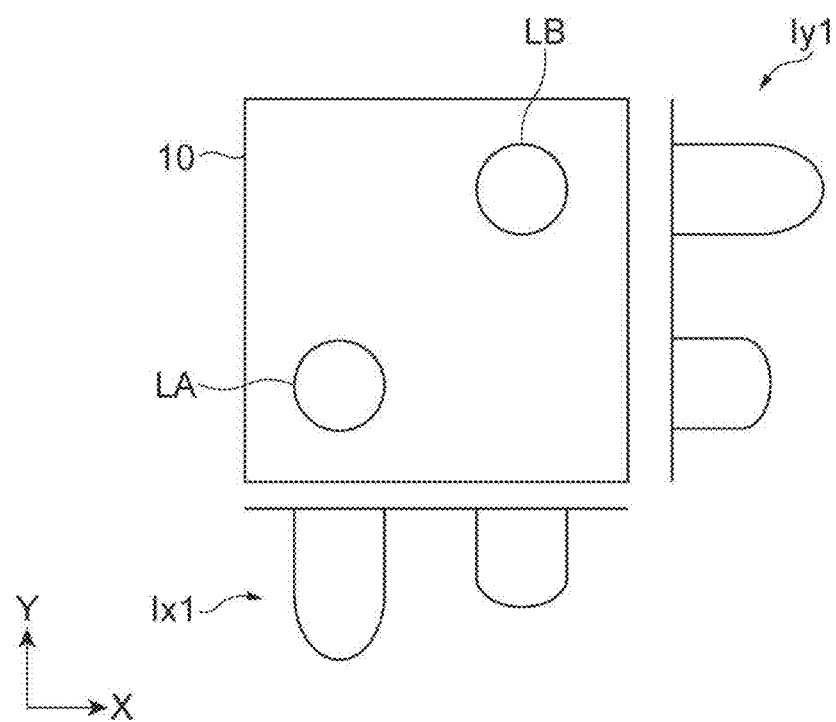
FIG. 5 is a view illustrating an operation and an effect of the position detection sensor of the embodiment.
Figure 5:
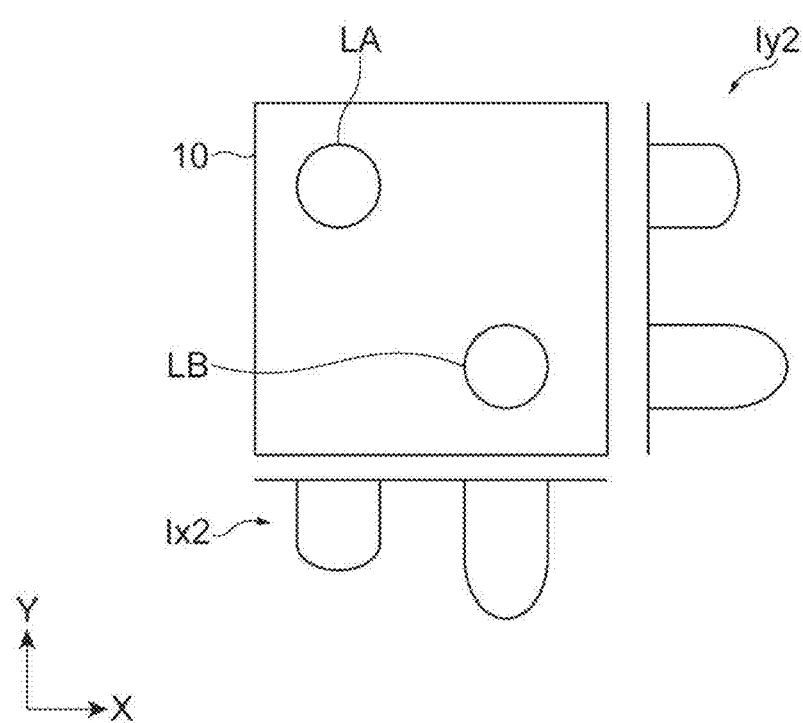

In contrast, in the position detection sensor 1 of this embodiment, the calculation unit 65 calculates the first weighting information PB2 and the second weighting information PA2 in addition to the first detection position PA1 and the second detection position PB1. in addition, the calculation unit 65 performs weighting on the first detection position PA1 with the second weighting information PA2, and performs weighting on the second detection position PB1 with the first weighting information PB2. In a case where a plurality of light spots having the same luminance are simultaneously incident to the light-receiving unit 10, the calculation unit 65 performs weighting on the first detection position PA1 of each of the light spots with the second weighting information PA2, and performs weighting on the second detection position PB1 of the light spot with the first weighting information PB2. FIG. 5 is a view illustrating an operation and an effect of the position detection sensor 1. (a) of FIG. 5 illustrates a state in which two light spots LA and LB having the same luminance are simultaneously incident to two corners of one diagonal line of the light-receiving unit 10, and illustrates a projection image Ix1 in the X-axis direction, and a projection image Iy1 in the Y-axis direction in combination. (b) of FIG. 5 illustrates a state in which two light spots LA and LB having the same luminance are simultaneously incident to two corners of the other diagonal line of the light-receiving unit 10, and illustrates a projection image Ix2 in the X-axis direction, and a projection image Iy2 in the Y-axis direction in combination.

As illustrated in (a) and (b) of FIG. 5, the projection image Ix1 in the X-axis direction and the projection image Ix2 in the X-axis direction are different, and the projection image Iy1 in the Y-axis direction and the projection image Iy2 in the Y-axis direction are different between a case where the two light spots LA and LB are simultaneously incident to the two corners on the one diagonal line of the light-receiving unit 10, and a case where the two light spots LA and LB are simultaneously incident to the two corners on the other diagonal line of the light-receiving unit 10. Accordingly, the calculation unit 65 can calculate the first detection position PA1 and the second detection position PB1 of each of the light spots LA and LB separately for each of the light spots LA and LB by using a difference between the projection images, that is, by using a difference between weighting by the first weighting information PB2 and weighting by the second weighting information PA2. That is, according to the position detection sensor 1, even in a case where a plurality of light spots having the same luminance are simultaneously incident to the light-receiving unit 10, it is possible to detect the first detection position PA1 and the second detection position PB1 with accuracy with respect to each of the light spots.

First Modification Example

Figure 6:
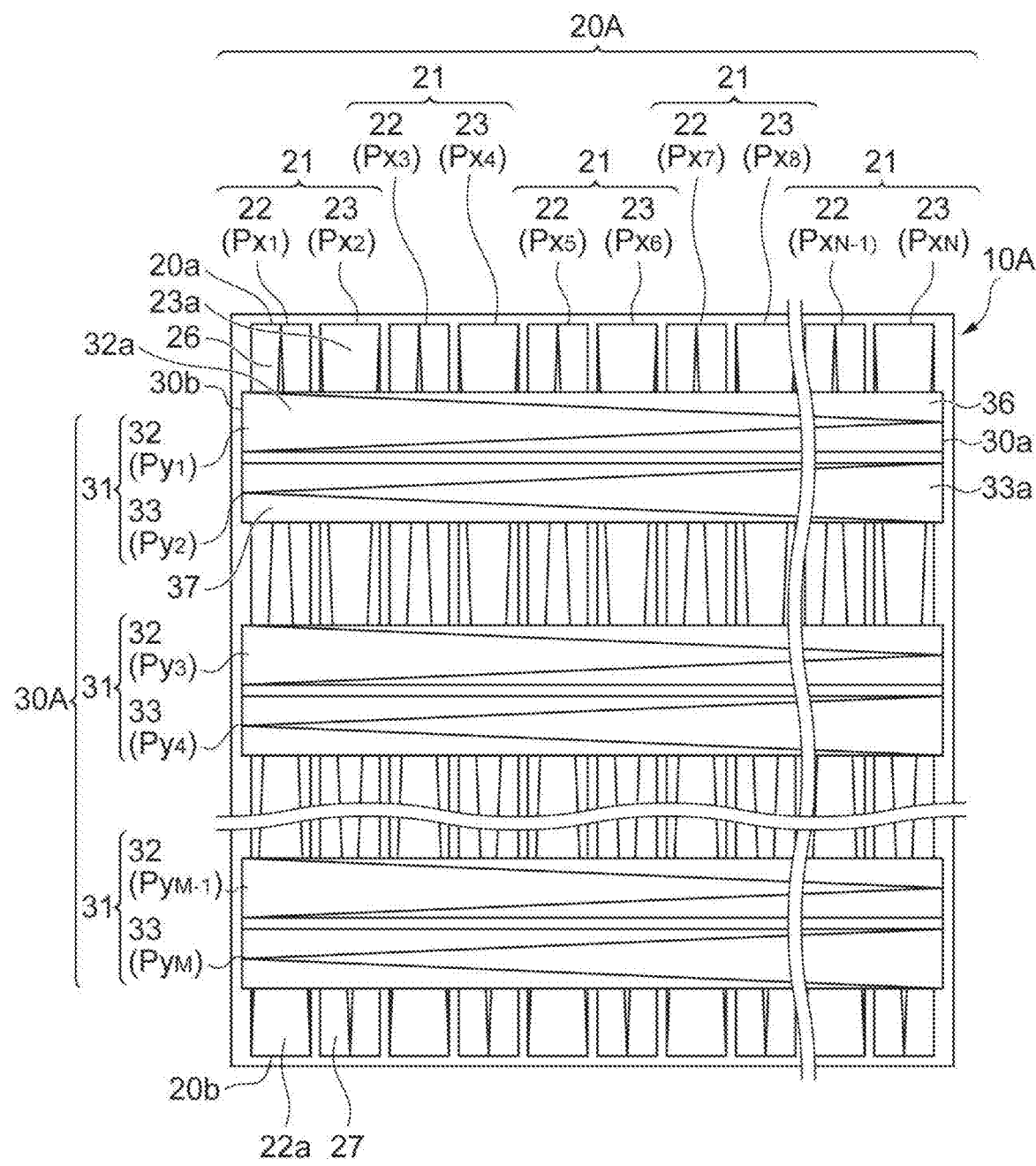
FIG. 6 is a schematic configuration diagram illustrating a light-receiving unit according to a first modification example.

FIG. 6 is a schematic configuration diagram illustrating a light-receiving unit 10A according to a first modification example. A difference between this modification example and the embodiment is in that a first pixel pair group 20A of the light-receiving unit 10A according to this modification example includes a plurality of first light-shielding parts 26 and a plurality of second light-shielding parts 27 instead of the plurality of first transmission filters 24 and the plurality of second transmission filters 25, and a second pixel pair group 30A of the light-receiving unit 10A includes a plurality of third light-shielding parts 36 and a plurality of fourth light-shielding parts 37 instead of the plurality of third transmission filters 34 and the plurality of fourth transmission filters 35.

Each of the first light-shielding parts 26 is disposed on each of the first pixel parts 22, and shields incident light. The first light-shielding part 26 covers another portion of the first pixel part 22 excluding one portion 22a thereof. A width of the one portion 22a in the X-axis direction gradually decreases (or decreases step by step) as it is closer to the one end 20a of the first pixel pair group 20A in the Y-axis direction, and gradually increases (or increases step by step) as it is closer to the other end 20b of the first pixel pair group 20A. In an example, the one portion 22a has an isosceles triangular shape that tapers toward the one end 20a side in the Y-axis direction. In this case, the first light-shielding part 26 has a shape that is hollowed out in the isosceles triangular shape.

Each of the second light-shielding parts 27 is disposed on each of the second pixel parts 23, and shields incident light. The second light-shielding part 27 covers another portion of each of the plurality of second pixel parts 23 excluding one portion 23a thereof. A width of the one portion 23a in the X-axis direction gradually increases (or increases step by step) as it is closer to the one end 20a in the Y-axis direction, and gradually decreases (or decreases step by step) as it is closer to the other end 20b in the Y-axis direction. In an example, the one portion 23a of each of the plurality of second pixel parts 23 has an isosceles triangular shape that tapers toward the other end 20b side in the Y-axis direction. In this case, the second light-shielding part 27 has a shape that is hollowed out in the isosceles triangular shape.

When the first pixel pair group 20A includes the first light-shielding part 26 and the second light-shielding part 27, the following operation is obtained. Specifically, in the first pixel parts 22, as the incident position of the light spot L is closer to the one end 20a in the Y-axis direction, an incident light amount of the light spot L incident to the first pixel parts 22 decreases, and according to this, the intensities of the charge signals $Dx_1, Dx_3, \ldots,$ and $Dx_{N-1}$ generated in the first pixel parts 22 also decrease. In contrast, in the second pixel parts 23, as the incident position of the light spot L is closer to the one end 20a in the Y-axis direction, an incident light amount of the light spot L incident to the second pixel parts 23 increases, and according to this, the intensities of the charge signals $Dx_2, Dx_4, \ldots,$ and $Dx_N$ which are generated in the second pixel parts 23 also increase.

Each of the third light-shielding parts 36 disposed on each of the third pixel parts 32 and shields incident light. The third light-shielding part 36 covers another portion of the third pixel part 32 excluding one portion 32a thereof. In the one portion 32a, a width in the Y-axis direction gradually decreases (or decreases step by step) as it is closer to the one end 30a of the second pixel pair group 30A in the X-axis direction, and gradually increases (or increases step by step) as it is closer to the other end 30b of the second pixel pair group 30A. In an example, the one portion 32a has an isosceles triangular shape that tapers toward the one end 30a side in the X-axis direction. In this case, the third light-shielding part 36 has a shape that is hollowed out in the isosceles triangular shape.

Each of the fourth light-shielding parts 37 is disposed on each of the fourth pixel parts 33, and shields incident light. The fourth light-shielding part 37 covers another portion of each of the plurality of fourth pixel parts 33 excluding one portion 33a thereof. A width of the one portion 33a in the Y-axis direction gradually increases (or increases step by step) as it is closer to the one end 30a in the X-axis direction, and gradually decreases (or decreases step by step) as it is closer to the other end 30b in the X-axis direction. In an example, the one portion 33a has an isosceles triangular shape that tapers toward the other end 30b side in the X-axis direction. In this case, the fourth light-shielding part 37 has a shape that is hollowed out in the isosceles triangular shape.

When the second pixel pair group 30A includes the third light-shielding part 36 and the fourth light-shielding part 37, the following operation is obtained. Specifically, in the third pixel parts 32, as the incident position of the light spot L is closer to the one end 30a in the X-axis direction, an incident light amount of the light spot L incident to the third pixel parts 32 decreases, and according to this, the intensities of the charge signals $Dy_1, Dy_3, \ldots,$ and $Dy_{M-1}$ generated in the third pixel parts 32 also decrease. In contrast, in the fourth pixel parts 33, as the incident position of the light spot L is closer to the one end 30a in the X-axis direction, an incident light amount of the light spot L incident to the fourth pixel parts 33 increases, and according to this, the intensities of the charge signals $Dy_2, Dy_4, \ldots,$ and $Dy_M$ generated in the fourth pixel parts 33 also increase.

Second Modification Example

Figure 7:
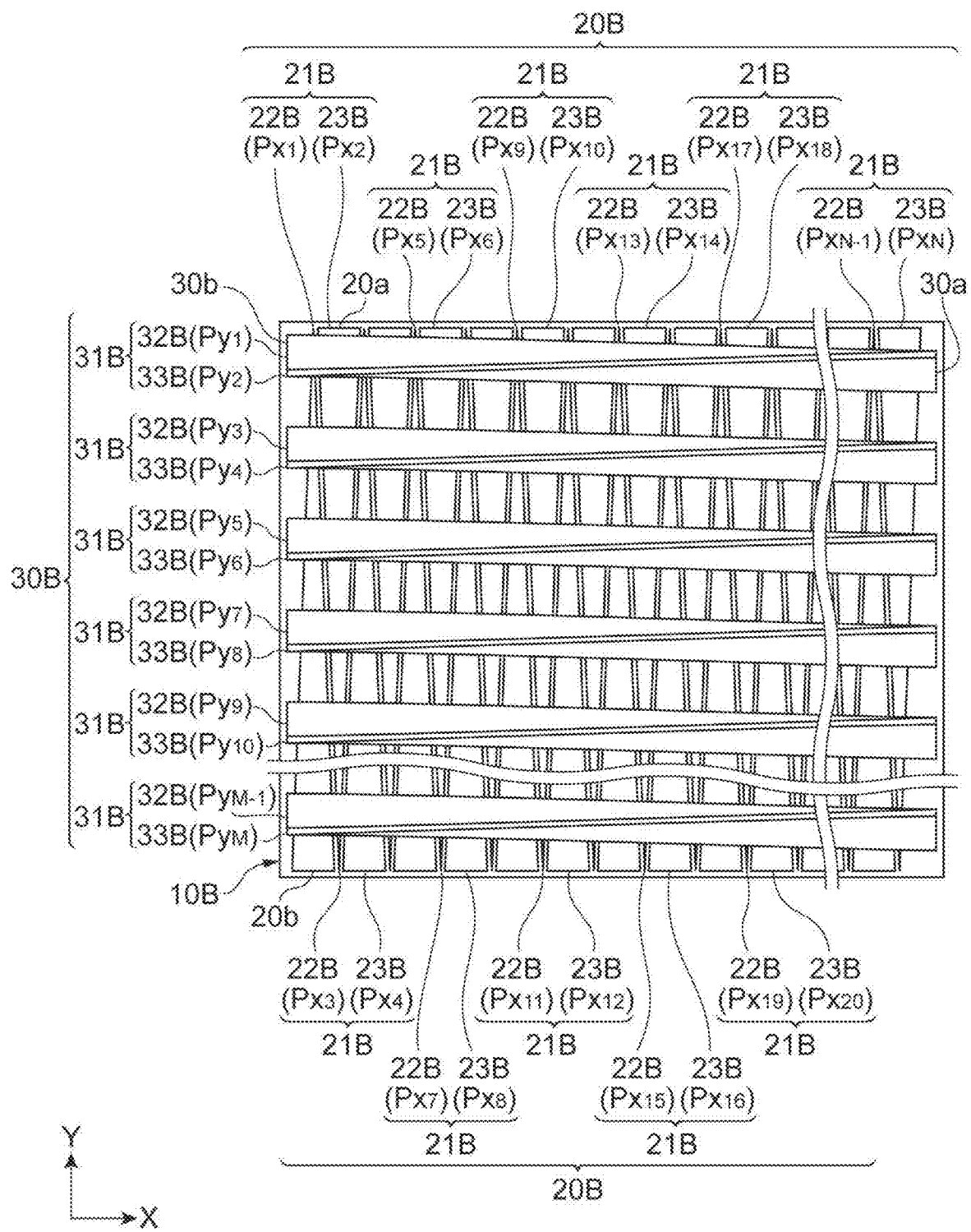
FIG. 7 is a schematic configuration diagram illustrating a light-receiving unit according to a second modification example.

FIG. 7 is a schematic configuration diagram illustrating a light-receiving unit 10B according to a second modification example. A difference between this modification example and the embodiment is in that a first pixel pair group 20B of the light-receiving unit 10B according to this modification example does not include the plurality of first transmission filters 24 and the plurality of second transmission filters 25, a second pixel pair group 30B of the light-receiving unit 10B does not include the plurality of third transmission filters 34 and the plurality of fourth transmission filters 35, and shapes of pixels of the first pixel pair group and the second pixel pair group are different. A width of each first pixel part 22B of first pixel pairs 21B of the first pixel pair group 20B in the X-axis direction gradually increases as it is closer to the one end 20a of the first pixel pair group 20B in the Y-axis direction, and gradually decreases as it is closer to the other end 20b of the first pixel pair group 20B. In an example, the first pixel part 22B has an isosceles triangular shape that tapers toward the one end 20a side in the Y-axis direction.

In contrast, a width of each second pixel part 23B in the X-axis direction gradually increases as it is closer to the one end 20a in the Y-axis direction, and gradually decreases as it is closer to the other end 20b in the Y-axis direction. In an example, the second pixel part 23B has an isosceles triangular shape that tapers toward the other end 20b side in the Y-axis direction. As in the above-described embodiment, a plurality of the first pixel parts 22B and a plurality of the second pixel parts 23B are collectively referred to as a plurality of pixel parts $Px_1$ to $Px_N$ (N is an integer of two or greater, and represents the number of pixels of the first pixel pair group 20B). Pixel parts $Px_1$, $Px_3$, . . . , and $Px_{N-1}$ assigned with odd numbers respectively correspond to the first pixel parts 22B, and the pixel parts $Px_2$, $Px_4$, . . . , and $Px_N$ assigned with even numbers respectively correspond to the second pixel parts 23B. Charge signals generated in the pixel parts $Px_1$ to $Px_N$ are referred to as $Dx_1$ to $Dx_N$.

When the first pixel pair group 20B includes the pixel parts $Px_1$ to $Px_N$, the following operation is obtained. Specifically, in the first pixel parts 22B, as the incident position of the light spot L is closer to the one end 20a in the Y-axis direction, an incident light amount of the light spot L incident to the first pixel parts 22B decreases, and according to this, the intensities of the charge signals $Dx_1$, $Dx_3$, . . . , and $Dx_{N-1}$ generated in the first pixel parts 22B also decrease. In contrast, in the second pixel parts 23B, as the incident position of the light spot L is closer to the one end 20a in the Y-axis direction, an incident light amount of the light spot L incident to the second pixel parts 23B increases, and according to this, the intensities of the charge signals $Dx_2$, $Dx_4$, . . . , and $Dx_N$ generated in the second pixel parts 23B also increase.

In each third pixel part 32B of second pixel pairs 31B of the second pixel pair group 30B, a width in the Y-axis direction gradually increases as it is closer to the one end 30a of the second pixel pair group 30B in the X-axis direction, and gradually decreases as it is closer to the other end 30b of the second pixel pair group 30B. In an example, the third pixel parts 32B has an isosceles triangular shape that tapers toward the one end 30a side in the X-axis direction. In contrast, a width of each fourth pixel part 33B in the Y-axis direction gradually increases as it is closer to the one end 30a in the X-axis direction, and gradually decrease as it is closer to the other end 30b in the X-axis direction. In an example, the fourth pixel part 33B has an isosceles triangular shape that tapers toward the other end 30b side in the X-axis direction.

As in the above-described embodiment, a plurality of the third pixel parts 32B and a plurality of the fourth pixel parts 33B are collectively referred to as a plurality of pixel parts $Py_1$ to $Py_M$ (M is an integer of two or greater, and represents the number of pixels of the second pixel pair group 30B). Pixel parts $Py_1$, $Py_3$, . . . , and $Py_{M-1}$ assigned with odd numbers respectively correspond to the third pixel parts 32B, and pixel parts $Py_2$, $Py_4$, . . . , and $Py_M$ assigned with even numbers respectively correspond to the fourth pixel parts 33B. In addition, charge signals generated in the pixel parts $Py_1$ to $Py_M$ are referred to as $Dy_1$ to $Dy_M$.

When the second pixel pair group 30B includes the pixel parts $Py_1$ to $Py_M$, the following operation is obtained. Specifically, in the third pixel parts 32B, as the incident position of the light spot L is closer to the one end 30a in the X-axis direction, an incident light amount of the light spot L incident to the third pixel parts 32B decreases, and according to this the intensities of the charge signals $Dy_1$, $Dy_3$, . . . , and $Dy_{M-1}$ generated in the third pixel parts 32B also decrease. In contrast, hi the fourth pixel parts 33B, as the incident position of the light spot L is closer to the one end 30a in the X-axis direction, an incident light amount of the light spot L incident to the fourth pixel parts 33B increases, and according to this, the intensities of the charge signals $Dy_2$, $Dy_4$, . . . , and $Dy_M$ generated in the fourth pixel parts 33B also increase.

Figure 8:
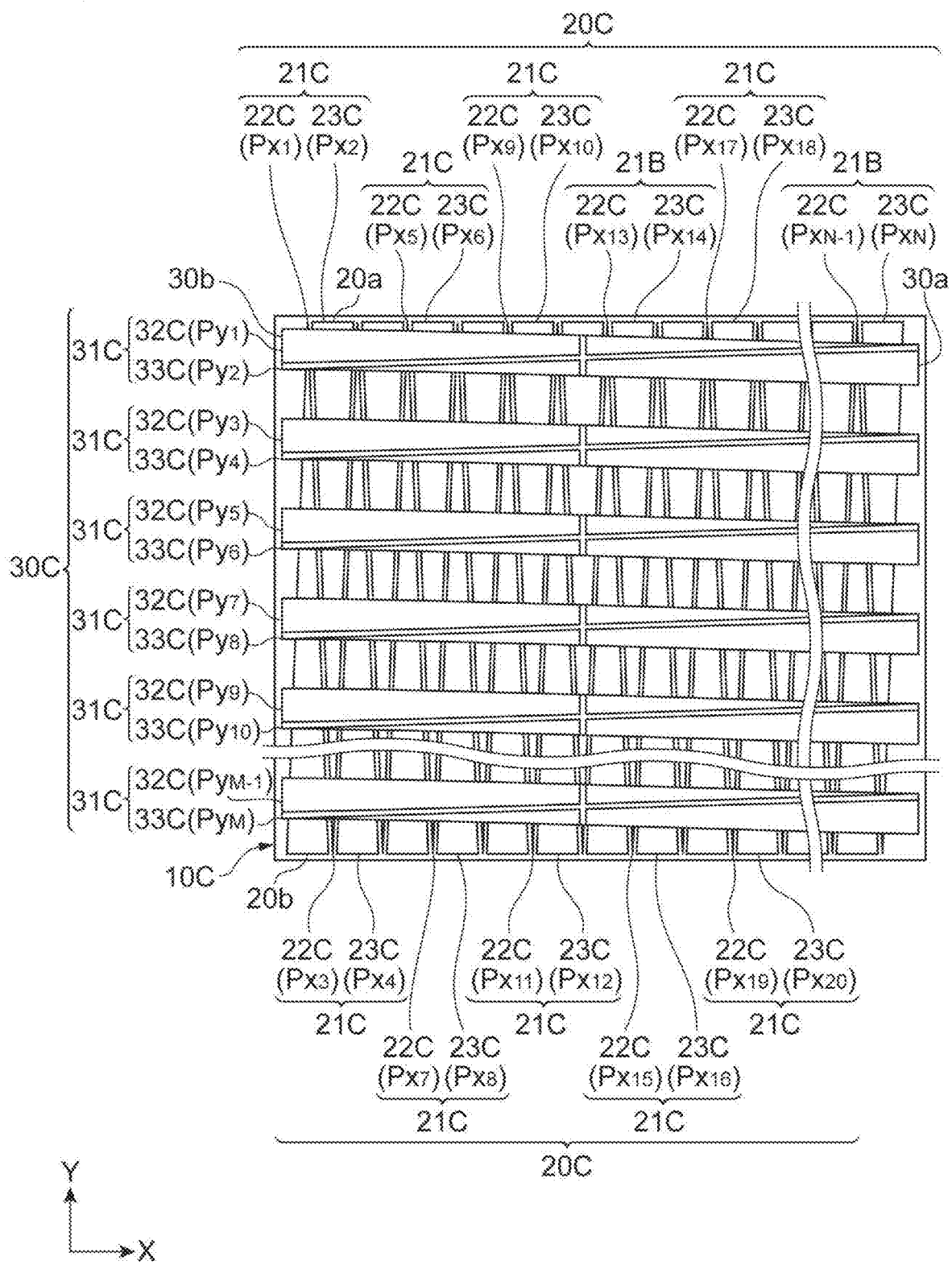
FIG. 8 is a schematic configuration diagram illustrating a light-receiving unit according to another example of the second modification example.

FIG. 8 is a schematic configuration diagram illustrating a. light-receiving unit 10C according to another example of this modification example. As illustrated in FIG. 8, pixel parts $Px_1$ to $Px_N$ (that is, first pixel parts 22C and second pixel parts 23C) of first pixel pairs 21C of a first pixel pair group 20C are divided into two parts at a boundary near the center in the Y-axis direction, and pixel parts $Py_1$ to $Py_M$ (that is, third pixel parts 32C and fourth pixel parts 33C) of second pixel pairs 31C of a second pixel pair group 30C are divided into two parts at a boundary near the center in the X-axis direction. In this case, the first signal processing unit 40 (refer to FIG. 1) is disposed on both sides of the pixel parts $Px_1$ to $Px_N$ of the first pixel pair group 20C in the Y-axis direction, and the second signal processing unit 50 (refer to FIG. 1) is disposed on both sides of the pixel parts $Py_1$ to $Py_M$ of the second pixel pair group 30C in the X-axis direction. In addition, the input terminals of the switch elements 41 of the first signal processing unit 40 are electrically connected to the pixel parts $Px_1$ to $Px_N$, and the input terminals of the switch elements 51 of the second signal processing unit 50 are electrically connected to the pixel parts $Py_1$ to $Py_M$. In the pixel parts $Px_1$ to $Px_N$, as the incident position of the light spot L in the Y-axis direction is further spaced apart from the switch elements 41, time for reading out the charge signals $Dx_1$ to $Dx_N$ generated in the pixel parts $Px_1$ to $Px_N$ is further taken. The reason for this is considered as follows. Since a movement speed of the charge signals $Dx_1$ to $Dx_N$ in a diffusion layer that constitutes the pixel parts $Px_1$ to $Px_N$ is slow, time is also taken for transferring the charge signals $Dx_1$ to $Dx_N$. This is also true of the pixel parts $Py_1$ to $Py_M$, and the charge signals $Dy_1$ to $Dy_M$. Here, in the light-receiving unit 10C of this modification example, the pixel parts $Px_1$ to $Px_N$ and the pixel parts $Py_1$ to $Py_M$ are divided into two parts, and the first signal processing unit 40 is disposed on both ends of the pixel parts $Px_1$ to $Px_N$ in the Y-axis direction, and the second signal processing unit 50 is disposed on both ends of the pixel parts $Py_1$ to $Py_M$ in the X-axis direction to shorten a distance from a portion to which the light spot L is incident in the pixel parts $Px_1$ to $Px_N$ and the pixel parts $Py_1$ to $Py_M$ to the switch elements 41 and 51. According to this, it is possible to suppress time necessary for reading out the charge signals $Dx_1$ to $Dx_N$ and the charge signals $Dy_1$ to $Dy_M$, and thus it is possible to make a frame rate be faster.

Third Modification Example

Figure 9:
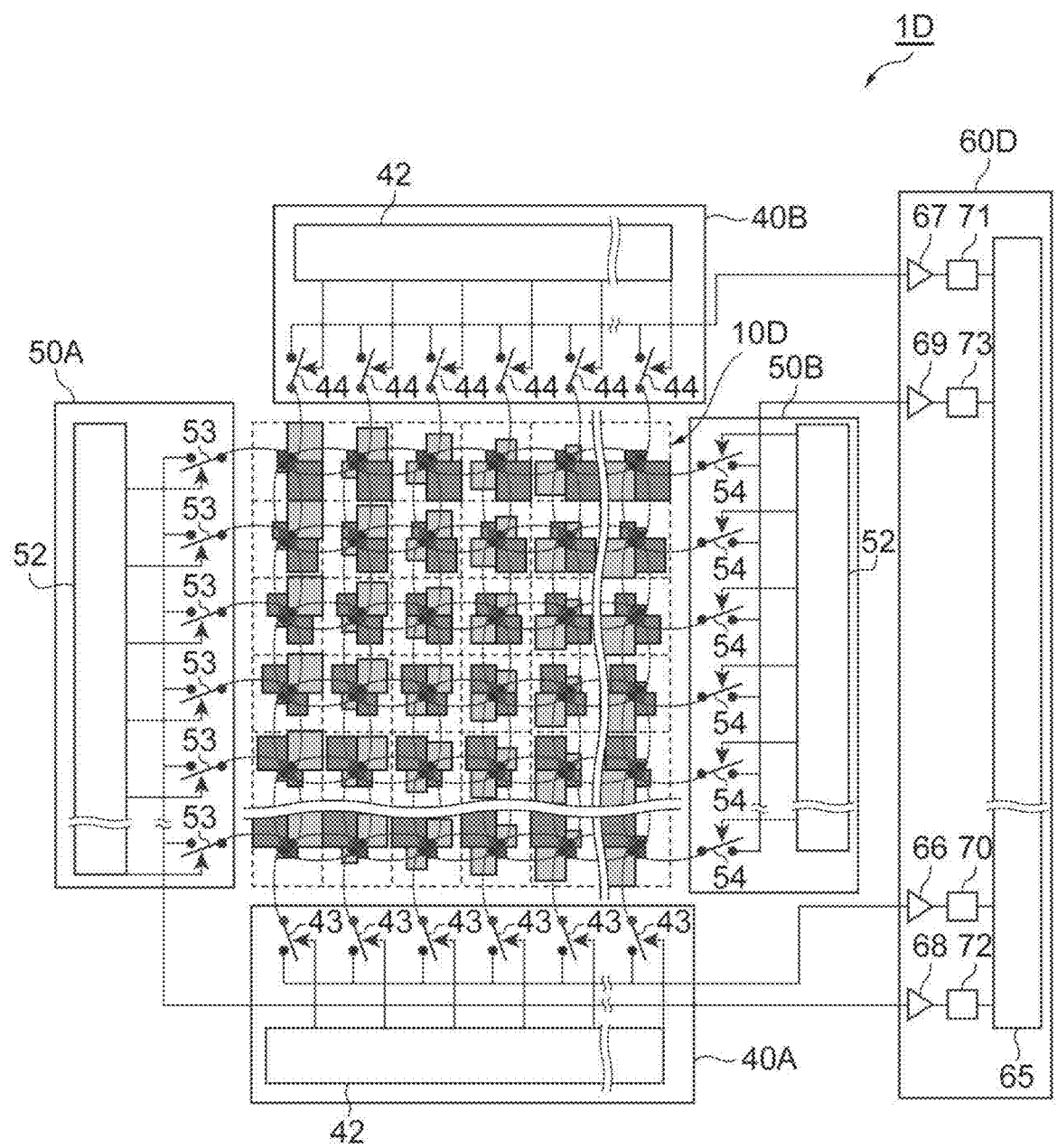
FIG. 9 is a schematic configuration diagram illustrating a position detection sensor including a light-receiving unit according to a third modification example.
Figure 10:
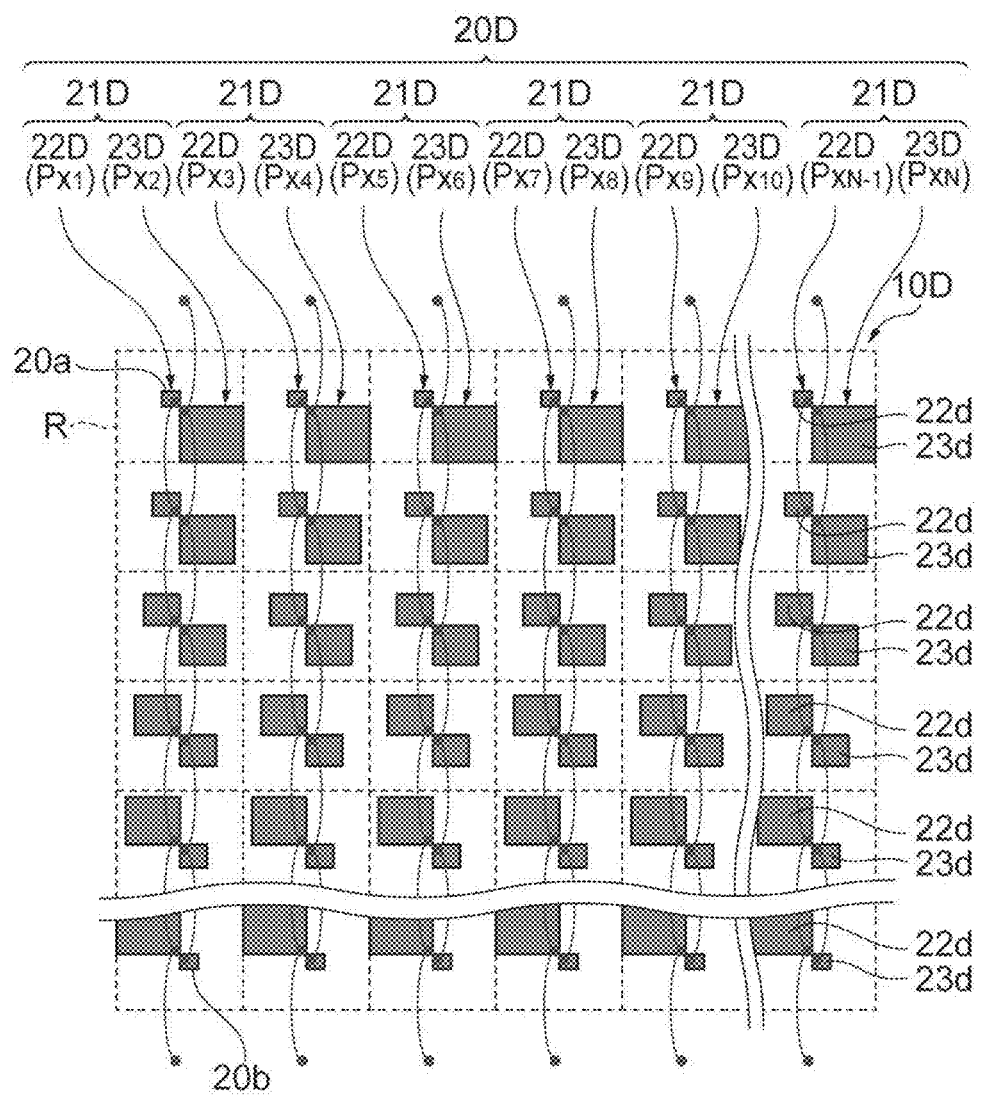
FIG. 10 is a schematic configuration diagram illustrating a first pixel pair group of the light-receiving unit according to the third modification example.
Figure 11:
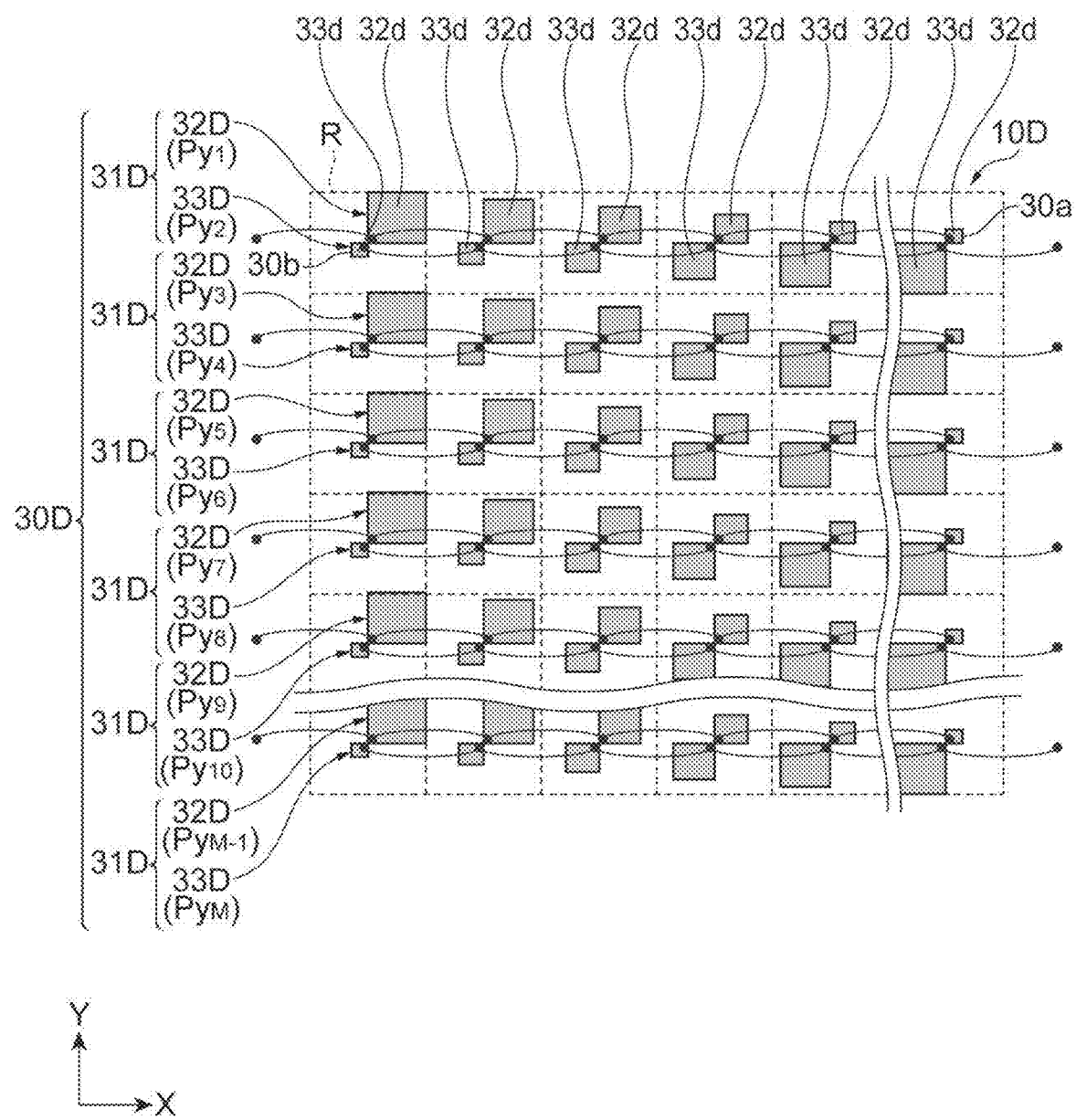
FIG. 11 is a schematic configuration diagram illustrating a second pixel pair group of the light-receiving unit according to the third modification example.

FIG. 9 is a schematic configuration diagram illustrating a position detection sensor 1D including a light-receiving unit 10D according to a third modification example. As illustrated in FIG. 9, the position detection sensor 1D includes the light-receiving unit 10D, first signal processing units 40A and 40B, second signal processing units 50A and 50B, and an operation processing unit 60D. FIG. 10 is a schematic configuration diagram illustrating a first pixel pair group 20D of the light-receiving unit 10D according to this modification example. FIG. 11 is a schematic diagram illustrating a second pixel pair group 30D of the light-receiving unit. 10D according to this modification example.

As illustrated in FIG. 10, a first pixel part 22D of each first pixel pair 21D of the first pixel pair group 20D includes a plurality of first pixels 22d. For example, the first pixels 22d have a square shape and are arranged along the Y-axis direction. The first pixels 22d are wired to each other in the Y-axis direction. A width of each of the first pixel 22d in the X-axis direction is smaller as the first pixel 22d is closer to the one end 20a in the Y-axis direction, and is larger as the first pixel 22d is closer to the other end 20b in the Y-axis direction. A width of the first pixel 22d in the Y-axis direction shows the same variation as the variation of the width of the first pixel 22d in the X-axis direction. That is, the width of the first pixel 22d in the Y-axis direction is smaller as the first pixel 22d is closer to the one end 20a in the Y-axis direction, and is larger as the first pixel 22d is closer to the other end 20b in the Y-axis direction. An area of the first pixel 22d is also smaller as the first pixel 22d is closer to the one end 20a in the Y-axis direction, and is also larger as the first pixel 22d is closer to the other end 20b in the Y-axis direction.

A second pixel part 23D of the first pixel pair 21D includes a plurality of second pixels 23d. For example, the second pixels 23d have a square shape and are arranged along the Y-axis direction. The second pixels 23d are wired to each other in the Y-axis direction. A width. of the second pixel part 23D in the X-axis direction is larger as the second pixel 23d is closer to the one end 20a in the Y-axis direction, and is smaller as the second pixel 23d is closer to the other end 20b in the Y-axis direction. A width of the second pixel 23d in the Y-axis direction shows the same variation as the variation of the width of the second pixel 23d in the X-axis direction. That is, the width of the second pixel 23d in the Y-axis direction is larger as the second pixel 23d is closer to the one end 20a in the Y-axis direction, and is smaller as the second pixel 23d is closer to the other end 20b in the Y-axis direction. Accordingly, an area of the second pixel 23d is also larger as the second pixel 23d is closer to the one end 20a in the Y-axis direction, and is also smaller as the second pixel 23d is closer to the other end 20b in the Y-axis direction.

As in the above-described embodiment, a plurality of the first pixel parts 22D and a plurality of the second pixel parts 23D are collectively referred to as a plurality of pixel parts $Px_1$ to $Px_N$. Pixel parts $Px_1$, $Px_3$, ..., and $Px_{N-1}$ assigned with odd numbers respectively correspond to the first pixel parts 22D, and pixel parts $Px_2$, $Px_4$, ..., and $Px_N$ assigned with even numbers respectively correspond to the second pixel parts 23D. In addition, charge signals (specifically, an integrated value of charge signals generated in the plurality of first pixels 22d or the plurality of second pixels 23d) generated in. the pixel parts $Px_1$ to $Px_N$ are referred to as $Dx_1$ to $Dx_N$. When the first pixel pair group 20D includes the pixel parts $Px_1$ to $Px_N$, the following operation is obtained.

That is, in the first pixel parts 22D, as the incident position of the light spot L is closer to the one end 20a in the Y-axis direction, an incident light amount of the light spot L incident to the first pixel parts 22D decreases, and according to this, the intensities of the charge signals $Dx_1$, $Dx_3$, ..., and $Dx_{N-1}$ generated in the first pixel parts 22D also decrease. In contrast, in the second pixel parts 23D, as the incident position of the light spot. L is closer to the one end 20a in the Y-axis direction, an incident light amount of the light spot L incident to the second pixel parts 23D increases, and according to this, the intensities of the charge signals $Dx_2$, $Dx_4$, ..., and $Dx_N$ generated in the second pixel parts 23D also increase.

As illustrated in FIG. 11, a third pixel part 32D of each second pixel pair 31D of the second pixel pair group 30D includes a plurality of third pixels 32d. For example, the third pixels 32d have a square shape and are arranged along the X-axis direction. The third pixels 32d are wired to each other along the X-axis direction. A width of each of the third pixels 32d in the Y-axis direction is smaller as the third pixel 32d is closer to the one end 30a in the X-axis direction, and is larger as the third pixel 32d is closer to the other end 30b in the X-axis direction. A width of the third pixel 32d in the X-axis direction shows the same variation as the variation of the width of the third pixel 32d in the Y-axis direction. That is, the width of the third pixel 32d in the X-axis direction is smaller as the third pixel 32d is closer to the one end 30a in the X-axis direction, and is larger as the third pixel 32d is closer to the other end 30b in the X-axis direction. An area of the third pixel 32d is also smaller as the third pixel 32d is closer to the one end 30a in the X-axis direction, and is also larger as the third pixel 32d is closer to the other end 30b in the X-axis direction.

A fourth pixel part 33D of the second pixel pair 31D includes a plurality of fourth pixels 33d. For example, the fourth pixels 33d have a square shape and are arranged along the X-axis direction, The fourth pixels 33d are wired to each other in the X-axis direction. A width of the fourth pixel part 33D in the Y-axis direction is larger as the fourth pixel 33d is closer to the one end 30a in the X-axis direction, and is smaller as the fourth pixel 33d is closer to the other end 30b in the X-axis direction. A width of the fourth pixel 33d in the X-axis direction shows the same variation as the variation of the width of the fourth pixel 33d in the Y-axis direction. That is, the width of the fourth pixel 33d in the X-axis direction is larger as the fourth pixel 33d is closer to the one end 30a in the X-axis direction, and is smaller as the fourth pixel 33d is closer to the other end 30b in the X-axis direction. Accordingly an area of the fourth pixel 33d is also larger as the fourth pixel 33d is closer to the one end 30a in the X-axis direction, and is also smaller as the fourth pixel 33d is closer to the other end 30b in the X-axis direction.

As in the above-described embodiment, a plurality of the third pixel parts 32D and a plurality of the fourth pixel parts 33D are collectively referred to as a plurality of pixel parts $Py_1$ to $Py_M$. Pixel parts $Py_1$, $Py_3$, ..., and $Py_{M-1}$ assigned with odd numbers respectively correspond to the third pixel parts 32D, and pixel parts $Py_2$, $Py_4$, ..., and $Py_M$ assigned with even numbers respectively correspond to the fourth pixel parts 33D. In addition, charge signals (specifically, an integrated value of charge signals generated in the plurality of third pixels 32d or the plurality of fourth pixels 33d) generated in the pixel parts $Py_1$ to $Py_M$ are referred to as $Dy_1$ to $Dy_M$. When the second pixel pair group 30D includes the pixel parts $Py_1$ to $Py_M$, the following operation is obtained. That is, in the third pixel parts 32D, as the incident position of the light spot L is closer to the one end 30a in the X-axis direction, an incident light amount of the light spot L incident to the third pixel parts 32D decreases, and according to this, the intensities of the charge signals $Dy_1$, $Dy_3$, ..., and $Dy_{M-1}$ generated in the third pixel parts 32D also decrease. in contrast, in the fourth pixel parts 33D, as the incident position of the light spot L is closer to the one end 30a in the X-axis direction, an incident light amount of the light spot L incident to the fourth pixel parts 33D increases, and according to this, the intensities of the charge signals $Dy_2$, $Dy_4$, ..., and $Dy_M$ generated in the fourth pixel parts 33D also increase.

As illustrated in HG 10 and FIG. 11, the light-receiving unit 10D is partitioned by a plurality of regions R which are two-dimensionally arranged along the X-axis direction and the Y-axis direction. The first pixel 22d, the second pixel 23d, the third pixel 32d, and the fourth pixel 33d are included in each of the regions R.

As illustrated in FIG. 9, the first signal processing unit 40A is disposed on one side of the light-receiving unit 10D in the Y-axis direction. The first signal processing unit 40A includes a plurality of switch elements 43 and a shift register 42. The switch elements 43 are provided in correspondence with the first pixel parts 22D (refer to FIG. 10), and have the same function as that of the switch elements 41. (refer to FIG. 1). Input terminals of the switch elements 43 are electrically connected to the first pixel parts 22D which are wired for every column along the Y-axis direction. The first signal processing unit 40B is disposed on a side opposite to the first signal processing unit 40A with respect to the light-receiving unit 10D. The first signal processing unit 40B includes a plurality of switch elements 44 and a shift register 42. The switch elements 44 are provided in correspondence with the second pixel parts 23D (refer to FIG. 10), and have the same function as that of the switch elements 41 (refer to FIG. 1). Input terminals of the switch elements 44 are electrically connected to the second pixel parts 23D which are wired for every column along the Y-axis direction.

The second signal processing unit 50A is disposed on one side of the light-receiving unit 10D in the X-axis direction. The second signal processing unit 50A includes a plurality of switch elements 53 and a shift register 52. The switch elements 53 are provided in correspondence with the third pixel part 32D (refer to FIG. 11), and have the same function as that of the switch elements 51 (refer to FIG. 1). Input terminals of the switch elements 53 are electrically connected to the third pixel parts 32D which are wired for every row along the X-axis direction. The second signal processing unit 50B are disposed on a side opposite to the second signal processing unit 50A with respect to the light-receiving unit 10D in the X-axis direction. The second signal processing unit 50B includes a plurality of switch elements 54 and a shift register 52. The switch elements 54 are provided in correspondence with the fourth pixel parts 33D (refer to FIG. 11), and have the same function as that of the switch elements 51 (refer to FIG 1). Input terminals of the switch elements 54 are electrically connected to the fourth pixel parts 33D which are wired for every row along the X-axis direction.

The operation processing unit 60D includes amplifiers 66, 67, 68, and 69 which are electrically connected to output terminals of the plurality of switch elements 43, 44, 53, and 54, A/D converters 70, 71, 72, and 73 which are electrically connected to the amplifiers 66, 67, 68, and 69, and the calculation unit 65 that is electrically connected to the A/D converters 70, 71, 72, and 73. The amplifiers 66, 67, 68, and 69 have the same function as that of the amplifiers 61 and 62. The A/D converters 70, 71, 72, and 73 have the same function as that of the A/D converters 63 and 64. The calculation unit 65 calculates the first detection position PA1 and the second detection position PB1 on the basis of charge signals output from the amplifiers 66, 67, 68, and 69.

Since the position detection sensor 1D according to this modification example has the above-described configuration, the first signal processing units 40A and 40B can read out the charge signals $Dx_1$ to $Dx_N$ output from the pixel parts $Px_1$ to $Px_N$ in parallel, and the second signal processing units 50A and 50B can read out the charge signals $Dy_1$ to $Dy_M$ output from the pixel parts $Py_1$ to $Py_M$ in parallel. According to this, a read-out speed of the charge signals can be made to be faster. Accordingly, according to the position detection sensor 1D of this modification example, it is possible to detect the first detection position PA1 and the second detection position PB1 at a high speed. Binning reading-out in which a plurality of adjacent pixels are treated as a unit pixel may be performed to realize an increase in a reading-out speed of respective charge signals.

Figure 12:
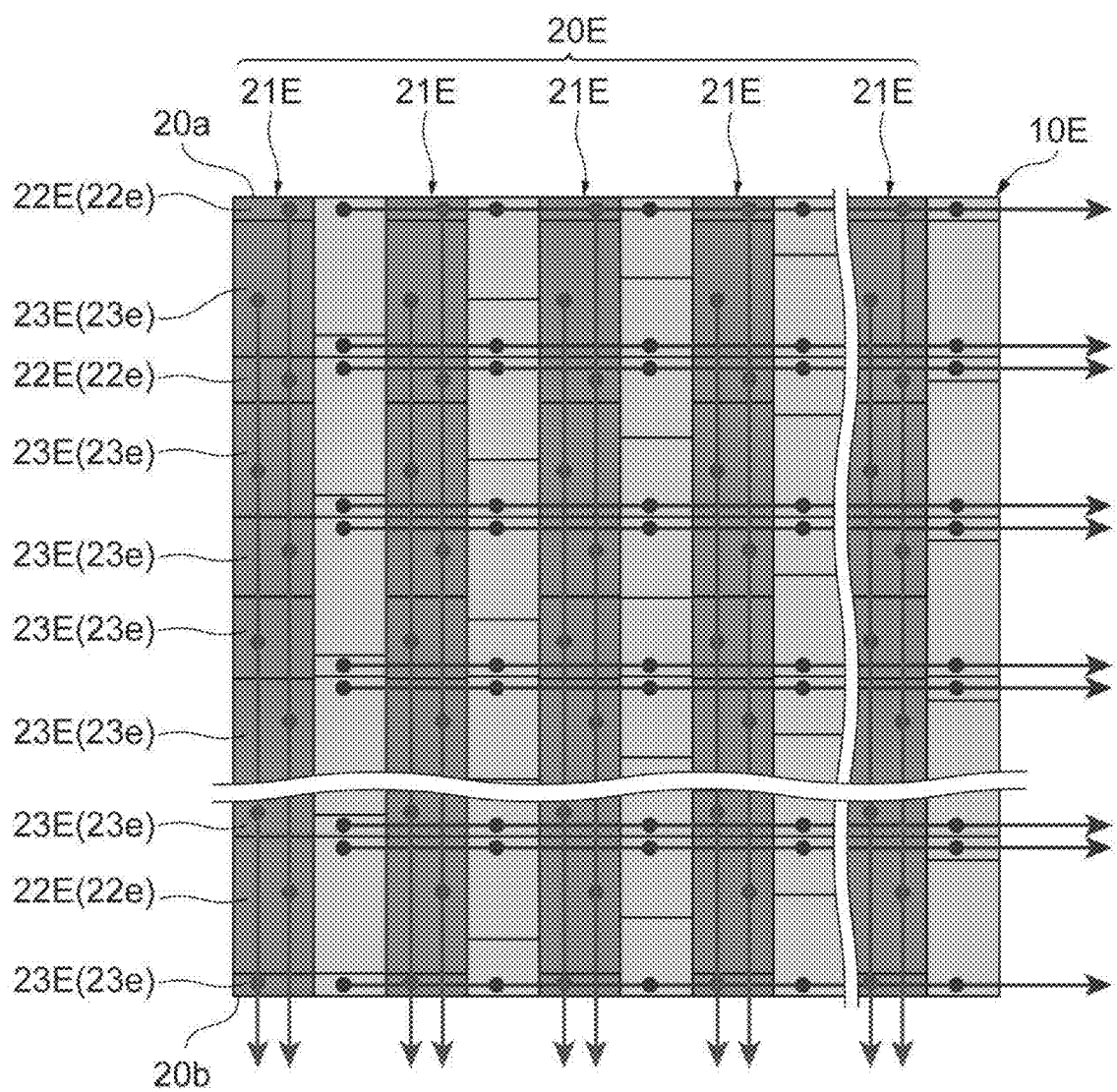
FIG. 12 is a schematic configuration diagram illustrating a light-receiving unit according to another example of the third modification example.

FIG. 12 is a schematic configuration diagram illustrating a light-receiving unit 10E according to another example of this modification example. A difference between the light-receiving unit 10E according to this modification example and the light-receiving unit 10D is in a shape and arrangement of pixels. In first pixel pairs 21E of a first pixel pair group 20E, for example, first pixels 22e of a first pixel part 22E and second pixels 23e of a second pixel part 23E have a rectangular shape, and are alternately disposed to be in contact with each other in the Y-axis direction. A width of each of the first pixels 22e in the X-axis direction and a width of each of the second pixels 23e in the X-axis direction match each other, and are constant regardless of a position in the Y direction.

A width of the first pixel 22e in the Y-axis direction shows the same variation as the variation of the width of the first pixel 22d in the Y-axis direction. That is, the width of the first pixel 22e in the Y-axis direction is smaller as the first pixel 22e is closer to the one end 20a in the Y-axis direction., and is larger as the first pixel 22e is closer to the other end 20b in the Y-axis direction. Accordingly, an area of the first pixel 22e is also smaller as the first pixel 22e is closer to the one end 20a in the Y-axis direction, and is also larger as the first pixel 22e is closer to the other end 20b in the Y-axis direction.

A width of the second pixel 23e in the Y-axis direction shows the same variation as the variation of the width of the second pixel 23d in the Y-axis direction. That is, the width of the second pixel 23e in the Y-axis direction is larger as the second pixel 23e is closer to the one end 20a in the Y-axis direction, and is smaller as the second pixel 23e is closer to the other end 20b in the Y-axis direction. Accordingly, an area of the second pixel 23e is also larger as the second pixel 23e is closer to the one end 20a in the Y-axis direction, and is also smaller as the second pixel 23e is closer to the other end 20b in the Y-axis direction.

Figure 13:
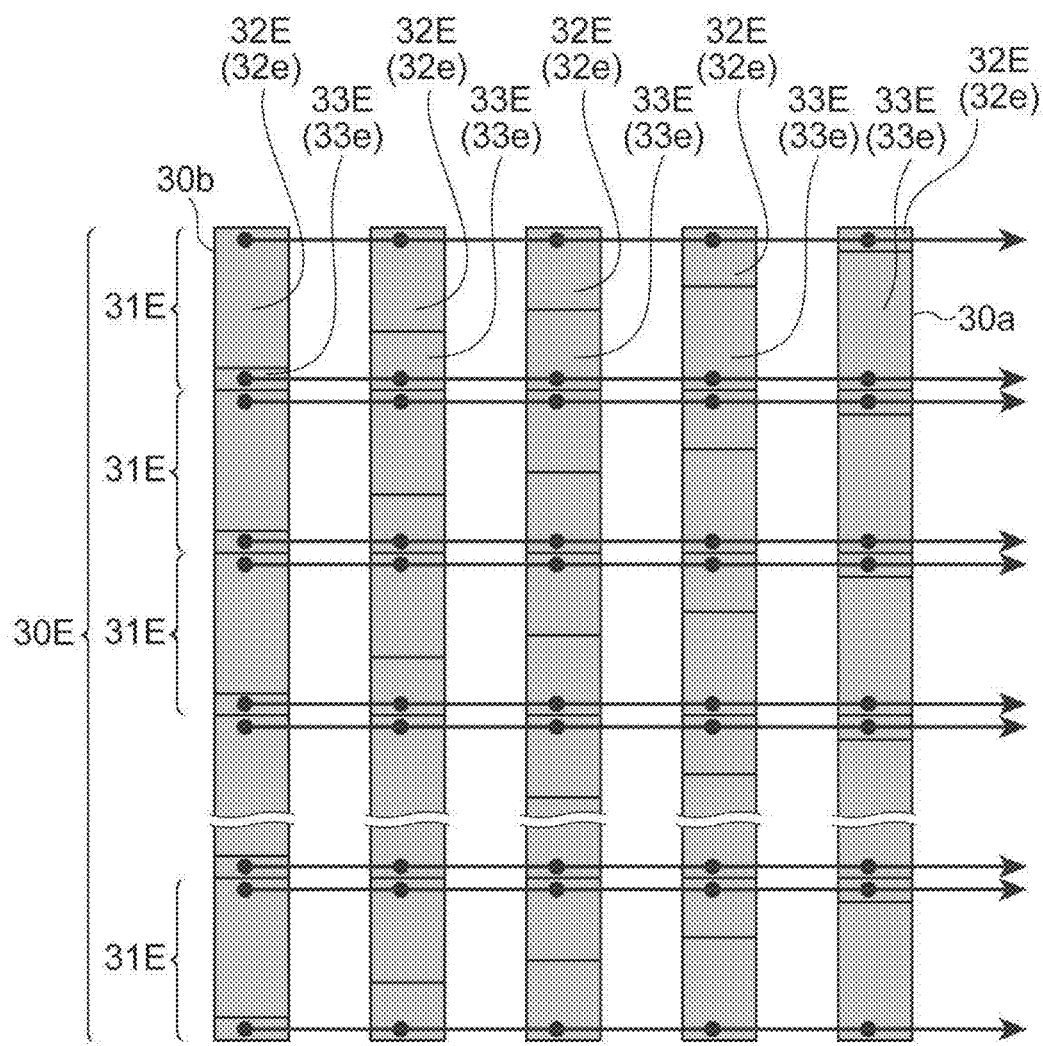
FIG. 13 is schematic configuration diagram illustrating a second pixel pair group of the light-receiving unit according to the other example of the third modification example.

FIG. 13 is a schematic configuration diagram illustrating a second pixel pair group 30E of the light-receiving unit 10E according to the other example of this modification example. In FIG. 13, the first pixel pair group 20E in FIG. 12 is omitted. In second pixel pairs 31E of the second pixel pair group 30E, for example, third pixels 32e of a third pixel part 32E and fourth pixels 33e of a fourth pixel part 33E have a rectangular shape, and are alternately disposed to be in contact with each other in the Y-axis direction. A width of each of the third pixels 32e in the X-axis direction and a width of each of the fourth pixels 33e in the X-axis direction match each other, and are constant regardless of a position in the Y-axis direction. A width of each of the third pixel 32e and the fourth pixel 33e in the X-axis direction is the same as the width of each of the first pixel 22e and the second pixel 23e in the X-axis direction.

A width of the third pixel 32e in the Y-axis direction shows the same variation as the variation of the width of the third pixel 32d in the Y-axis direction. That is, the width of the third pixel 32e in the Y-axis direction is smaller as the third pixel 32e is closer to the one end 30a in the X-axis direction, and is larger as the third pixel 32e is closer to the other end 30b in the X-axis direction. Accordingly, an area of the third pixel 32e is also smaller as the third pixel 32e is closer to the one end 30a in the X-axis direction, and is also larger as the third pixel 32e is closer to the other end 30b in the X-axis direction.

A width of the fourth pixel 33e in the Y-axis direction shows the same variation. as the variation of the width of the fourth pixel 33d in the Y-axis direction. That is, the width of the fourth pixel 33e in the Y-axis direction is larger as the fourth pixel 33e is closer to the one end 30a in the X-axis direction, and is smaller as the fourth pixel 33e is closer to the other end 30b in the X-axis direction. Accordingly, an area of the fourth pixel 33e is also larger as the fourth pixel 33e is closer to the one end 30a in the X-axis direction, and is also smaller as the fourth pixel 33e is closer to the other end 30b in the X-axis direction.

Referring to both FIG. 12 and FIG. 13, the first pixel pair group 20E and the second pixel pair group 30E are alternately aligned to be in contact with each other in the Y-axis direction, and thus it can be understood that the first pixel 22e, the second pixel 23e, the third pixel 32e, and the fourth pixel 33e are disposed with no gap therebetween. When the pixels are disposed in this manner, it is possible to improve an aperture ratio of the light-receiving unit 10E. As a result, it is possible to raise sensitivity with respect to the incident light spot L, and it is possible to realize enlargement of a dynamic range.

Fourth Modification Example

Figure 14:
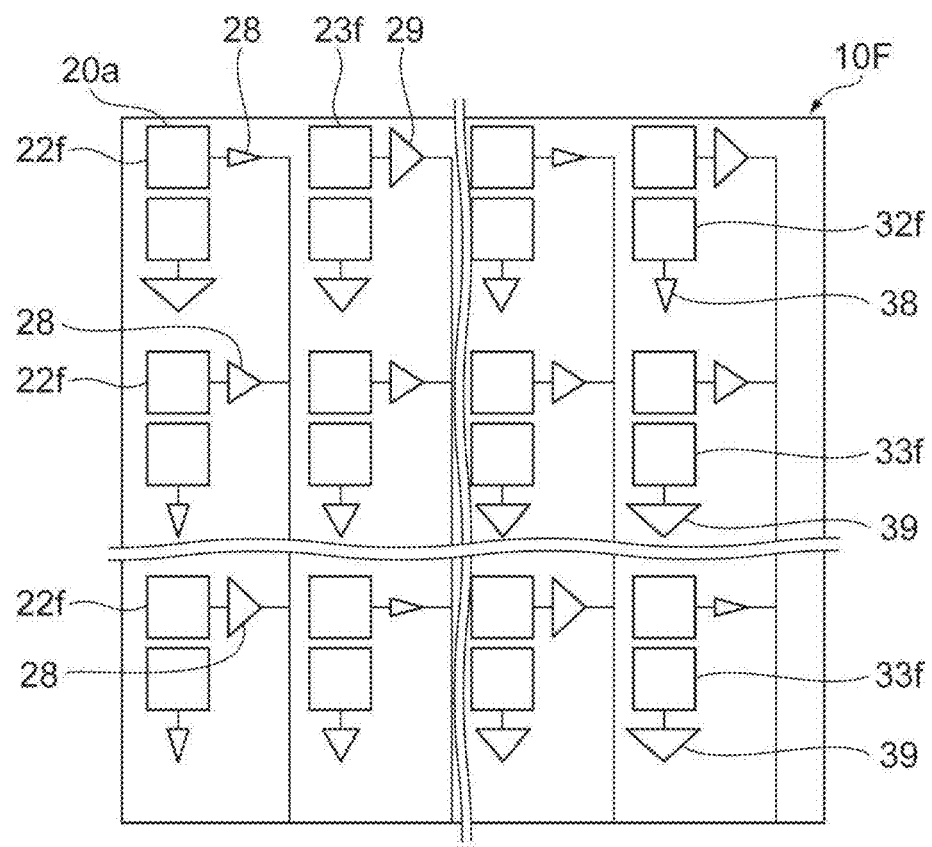
FIG. 14 is a schematic configuration diagram illustrating a light-receiving unit according to a fourth modification example.
Figure 15:
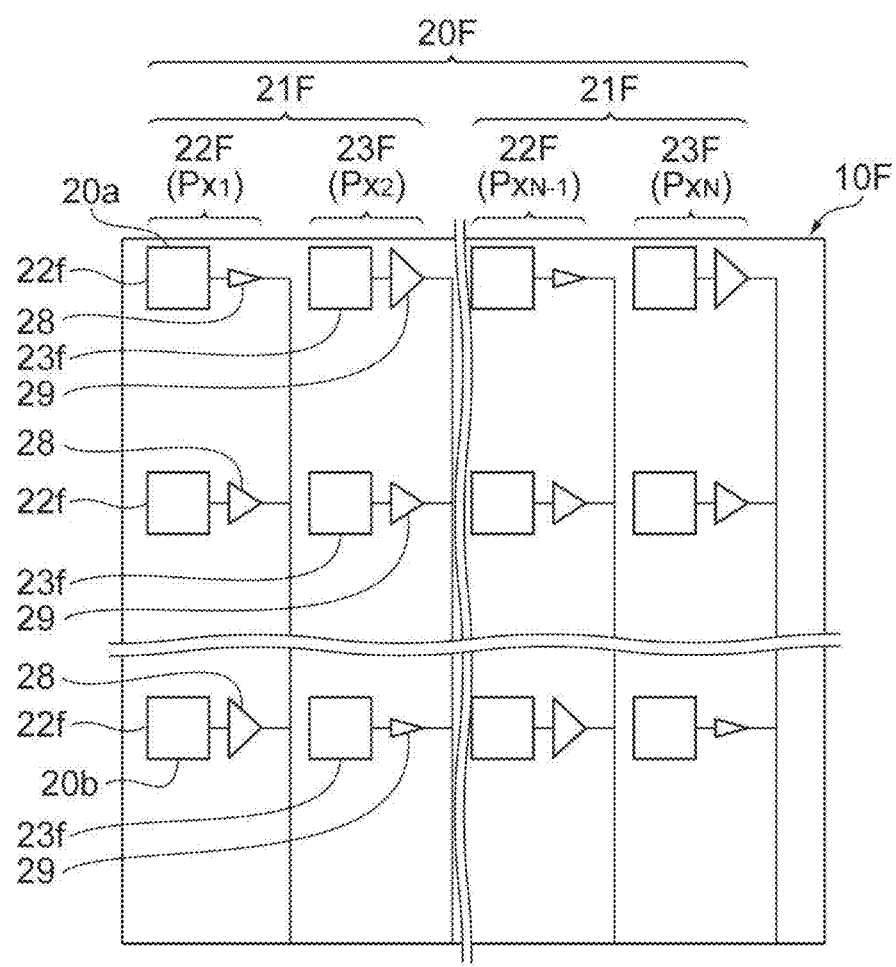
FIG. 15 is a schematic configuration diagram illustrating a first pixel pair group of the light-receiving unit according to the fourth modification example.
Figure 16:
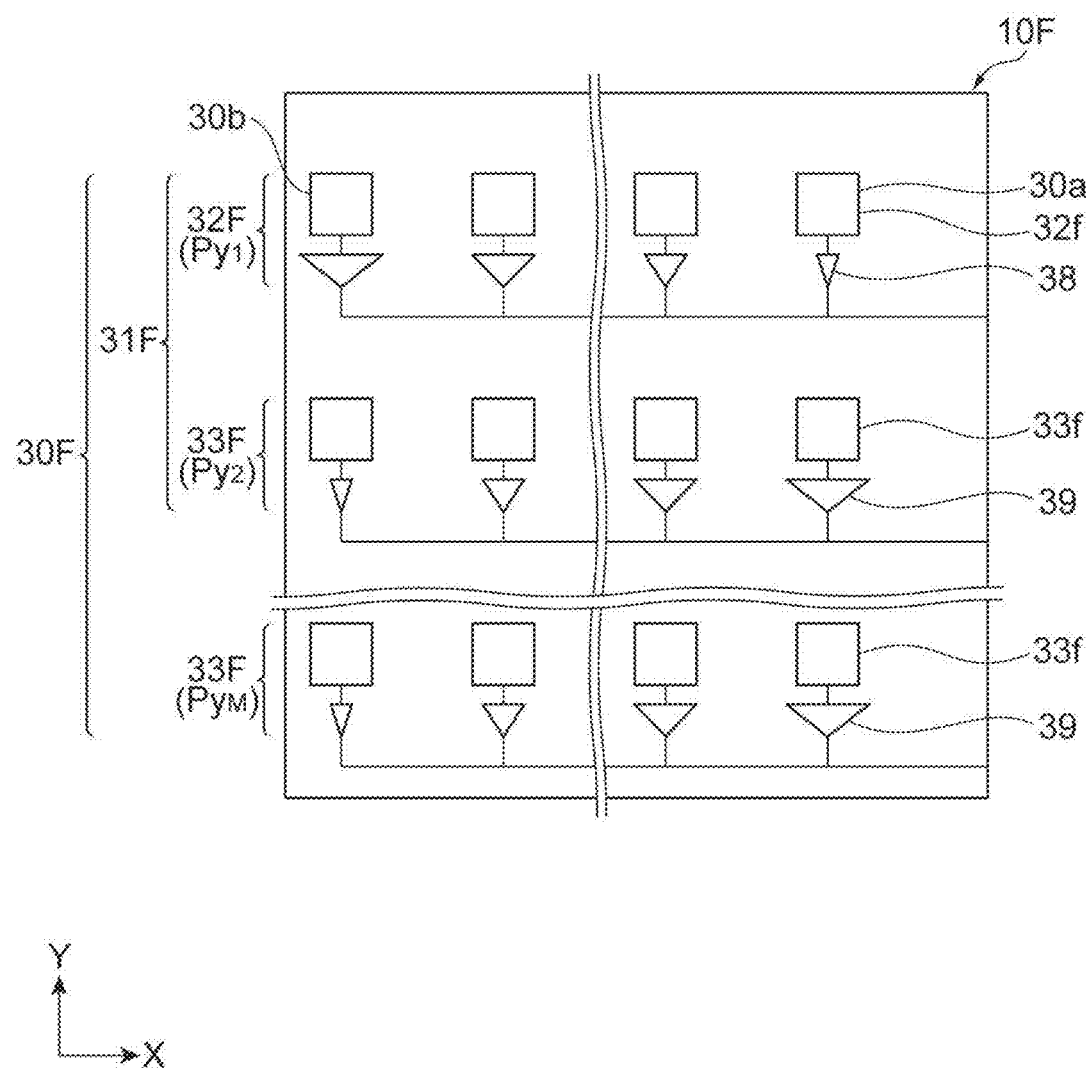
FIG. 16 is a schematic configuration diagram illustrating a second pixel pair group of the light-receiving unit according to the fourth modification example.

FIG. 14 is a schematic configuration diagram illustrating a light-receiving unit 10F according to a fourth modification example. FIG. 15 is a schematic configuration diagram illustrating a first pixel pair group 20F of the light-receiving unit 10F according to this modification example. FIG. 16 is a schematic configuration diagram illustrating a second pixel pair group 30F of the light-receiving unit 10F according to this modification example. As illustrated in FIG. 15, a first pixel part 22F of first pixel pairs 21F of the first pixel pair group 20F includes a plurality of first pixels 22f and a plurality of first amplifiers 28. For example, the plurality of first pixels 22f have a square shape and are arranged along the Y-axis direction. Areas of the first pixels 22f are the same as each other. The plurality of first amplifiers 28 are electrically connected to the plurality of first pixels 22f. Each of the first amplifiers 28 amplifies an intensity of a charge signal generated in each of the first pixels 22f. An amplification rate of the first amplifier 28 is smaller as the first pixel 22f electrically connected to the first amplifier 28 is closer to the one end 20a of the first pixel pair group 20F in the Y-axis direction, and is larger as the first pixel 22f is closer to the other end 20b in the Y-axis direction. Output terminals of the first amplifiers 28 are wired to each other in the Y-axis direction, and are electrically connected to input terminals of the switch elements 41 (refer to FIG. 1).

A second pixel part 23F of the first pixel pairs 21F includes a plurality of second pixels 23f and, a plurality of second amplifiers 29. For example, the plurality of second pixels 23f have a square shape and are arranged along the Y-axis direction. Areas of the second pixels 23f are the same as each other. The plurality of second amplifiers 29 are electrically connected to the plurality of second pixels 23f. Each of the second amplifiers 29 amplifies an intensity of a charge signal generated in each of the second pixels 23f. An amplification rate of the second amplifier 29 is larger as the second pixel 23f electrically connected to the second amplifier 29 is closer to the one end 20a in the Y-axis direction, and is smaller as the second pixel 23f is closer to the other end 20b in the Y-axis direction. Output terminals of the second amplifiers 29 are wired to each other in the Y-axis direction, and are electrically connected to the input terminals of the switch elements 41 (refer to FIG. 1). Charge signals amplified by the first amplifiers 28 are collectively input to the input terminals of the switch elements 41 or charge signals amplified by the second amplifiers 29 are collectively input to the input terminals.

As in the above-described embodiment, a plurality of the first pixel parts 22F and a plurality of the second pixel parts 23F are collectively referred to as a plurality of pixel parts $Px_1$ to $Px_N$ (N is an integer of two or greater, and represents the number of pixels of the first pixel pair group 20F). Pixel parts $Px_1$, $Px_3$, . . . , and $Px_{N-1}$ assigned with odd numbers respectively correspond to the first pixel parts 22F, and pixel parts $Px_2$, $Px_4$, . . . , and $Px_N$ assigned with even numbers respectively correspond to the second pixel parts 23F. In addition, charge signals output from the pixel parts $Px_1$ to $Px_N$ (specifically, an integrated value of charge signals output from the plurality of first amplifiers 28 or the plurality of second amplifiers 29) are referred to as $Dx_1$ to $Dx_N$. When the first pixel pair group 20F includes the pixel parts $Px_1$ to $Px_N$, the following operation is obtained. That is, in the first pixel parts 22F, as the incident position of the light spot L is closer to the one end 20a in the Y-axis direction, intensities of the charge signals $Dx_1$, $Dx_3$, . . . , and $Dx_{N-1}$ output from the first pixel parts 22F decrease. In contrast, in the second pixel parts 23F, as the incident position of the light spot L is closer to the one end 20a in the Y-axis direction, intensities of the charge signals $Dx_2$, $Dx_4$, . . . , and $Dx_N$ output from the second pixel parts 23F increase.

As illustrated in FIG. 16, a third pixel part 32F of second pixel pairs 31F of the second pixel pair group 30F includes a plurality of third pixels 32f and a plurality of third amplifiers 38. For example, the plurality of third pixels 32f have a square shape and are arranged along the X-axis direction. Areas of the third pixels 32f are the same as each other. The plurality of third amplifiers 38 are electrically connected to the plurality of third pixels 32f. Each of the third amplifiers 38 amplifies an intensity of a charge signal generated in each of the third pixels 32f. An amplification rate of the third amplifier 38 is smaller as the third pixel 32f electrically connected to the third amplifier 38 is closer to the one end 30a of the first pixel pair group 20F in the X-axis direction, and is larger as the third pixel 32f is closer to the other end 30b in the X-axis direction. Output terminals of the third amplifiers 38 are wired to each other in the X-axis direction, and are electrically connected to input terminals of the switch elements 51 (refer to FIG. 1).

A fourth pixel part 33F of the second pixel pairs 31F includes a plurality of fourth pixels 33f and a plurality of fourth amplifiers 39. For example, the plurality of fourth pixels 33f have a square shape and are arranged along the X-axis direction. Areas of the fourth pixels 33f are the same as each other. The plurality of fourth amplifiers 39 are electrically connected to the plurality of fourth pixels 33f.

Each of the fourth amplifiers 39 amplifies an intensity of a charge signal generated in each of the fourth pixels 33f. An amplification rate of the fourth amplifier 39 is larger as the fourth pixel 33f electrically connected to the fourth amplifier 39 is closer to the one end 30a in the X-axis direction, and is smaller as the fourth pixel 33f is closer to the other end 30b in the X-axis direction. Output terminals of the fourth amplifiers 39 are wired to each other in the X-axis direction, and are electrically connected to the input terminals of the switch elements 51 (refer to FIG. 1). Charge signals amplified by the third amplifiers 38 are collectively input to the input terminals of the switch elements 51 or charge signals amplified by the fourth amplifiers 39 are collectively input to the input terminals.

As in the above-described embodiment, a plurality of the third pixel parts 32F and a plurality of the fourth pixel parts 33F are collectively referred to as a plurality of pixel parts $Py_1$ to $Py_M$ (M is an integer of two or greater, and represents the number of pixels of the second pixel pair group 30F). Pixel parts $Py_1$, $Py_3$, . . . , and $Py_{M-1}$ assigned with odd numbers respectively correspond to the third pixel parts 32F, and pixel parts $Py_2$, $Py_4$, . . . , and $Py_M$ assigned with even numbers respectively correspond to the fourth pixel parts 33F. In addition, charge signals generated in the pixel parts $Py_1$ to $Py_M$ (specifically, an integrated value of charge signals output from the plurality of third amplifiers 38 or the plurality of fourth amplifiers 39) are referred to as $Dy_1$ to $Dy_M$. When the second pixel pair group 30F includes the pixel parts $Py_1$ to $P_M$, the following operation is obtained. That is, in the third pixel parts 32F, as the incident position of the light spot L is closer to the one end 30a in the X-axis direction, intensities of the charge signals $Dy_1$, $Dy_3$, . . . , and $Dy_{M-1}$ output from the third pixel parts 32F decrease. In contrast, in the fourth pixel parts 33F, as the incident position of the light spot L is closer to the one end 30a in the X-axis direction, intensities of the charge signals $Dy_2$, $Dy_4$, . . . , and $Dy_M$ output from the fourth pixel parts 33F increase.

Fifth Modification Example

Figure 17:
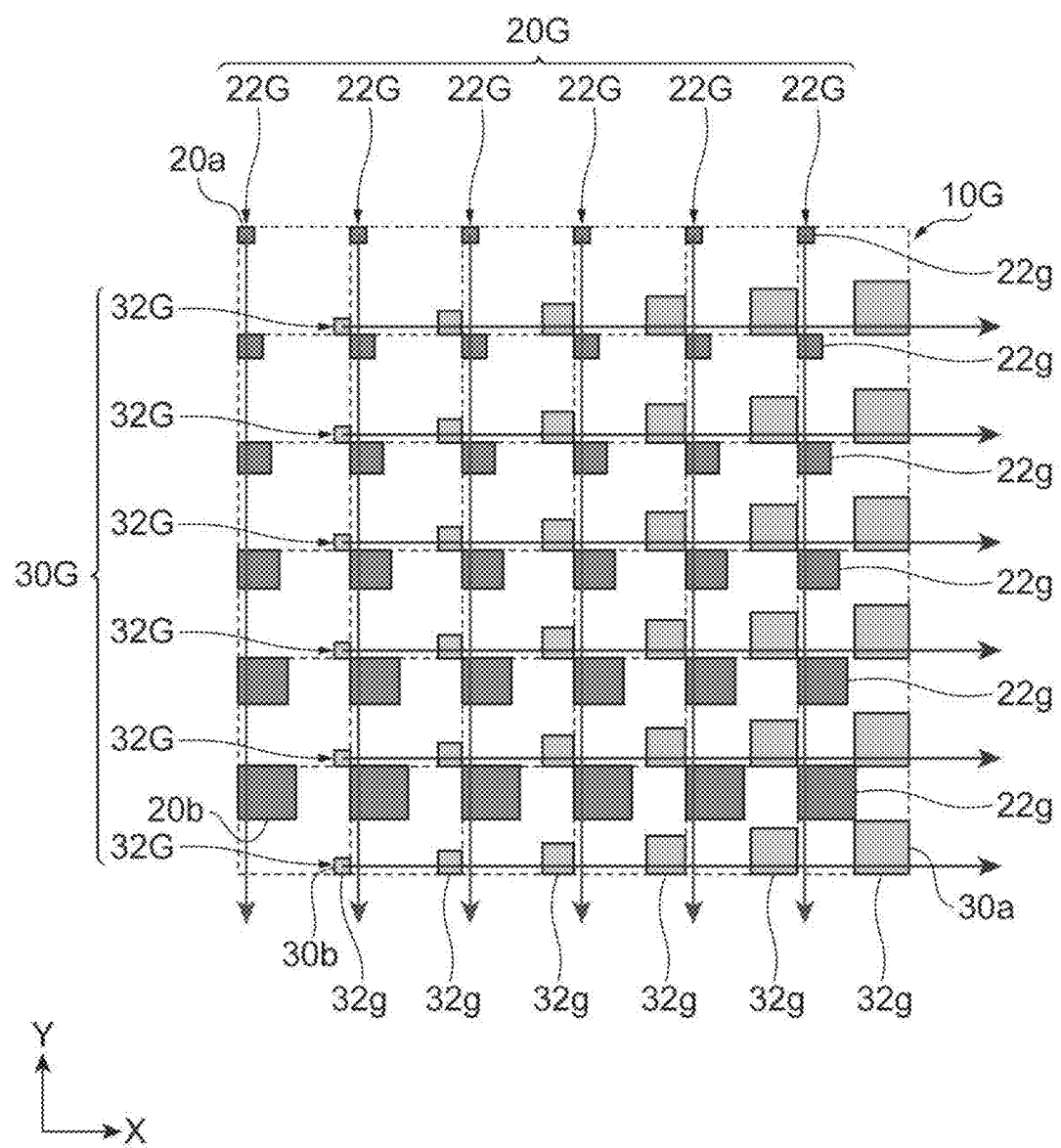
FIG. 17 is a schematic configuration diagram illustrating light-receiving unit according to a fifth modification example.

FIG. 17 is a schematic configuration diagram illustrating a light-receiving unit 10G according to a fifth modification example. A first pixel part 22G of a first pixel group 20G of the light-receiving unit 10G includes a plurality of first pixels 22g. The first pixel group 20G corresponds to the first pixel pair group 20 in the embodiment. For example, the first pixels 22g have a square shape, and are arranged along the Y-axis direction. The first pixels 22g are wired to each other in the Y-axis direction. A width of each of the first pixels 22g in the X-axis direction is smaller as the first pixel 22g is closer to the one end 20a in the Y-axis direction, and is larger as the first pixel 22g is closer to the other end 20b in the Y-axis direction. A width of the first pixel 22g in the Y-axis direction shows the same variation as the variation of the width of the first pixel 22g in the X-axis direction. That is, the width of the first pixel 22g in the Y-axis direction is smaller as the first pixel 22g is closer to the one end 20a in the Y-axis direction, and is larger as the first pixel 22g is closer to the other end 20b in the Y-axis direction. Accordingly, an area of a light-receiving region constituted by the first pixel 22g in the first pixel parts 22G decreases step by step as it is closer to the one end 20a in the Y-axis direction, and increases step by step as it is closer to the other end 20b in the Y-axis direction. When the first pixel group 20G includes the first pixel parts 22G, in the first pixel parts 22G, as the incident position of the light spot L is closer to the one end 20a in the Y-axis direction, an incident light amount of the light spot L incident to the first pixel parts 22G decreases, and according to this, intensities of charge signals (first electric signals) generated in the first pixel parts 22G also decrease. The charge signals are referred to as $Dx_1$ to $Dx_N$.

A second pixel part 32G of a second pixel group 30G of the light-receiving unit 10G includes a plurality of second pixels 32g. The second pixel group 30G corresponds to the second pixel pair group 30 in the embodiment. The second pixel part 32G corresponding to the fourth pixel part 33 in the embodiment. For example, the second pixels 32g have a square shape, and are arranged along the X-axis direction. The second pixels 32g are wired to each other in the X-axis direction. A width of each of the second pixels 32g in the Y-axis direction is larger as the second pixel 32g is closer to the one end 30a in the X-axis direction, and is smaller as the second pixel 32g is closer to the other end 30b in the X-axis direction. A width of the second pixel 32g in the X-axis direction shows the same variation as the variation of the width of the second pixel 32g in the Y-axis direction. That is, the width of the second pixel 32g in the X-axis direction is larger as the second pixel 32g is closer to the one end 30a in the X-axis direction, and is smaller as the second pixel 32g is closer to the other end 30b in the X-axis direction. Accordingly, an area of a light-receiving region constituted by the second pixel 32g in the second pixel parts 32G increases step by step as it is closer to the one end 30a in the X-axis direction, and decreases step by step as it is closer to the other end 30b in the X-axis direction. When the second pixel group 30G includes the second pixel parts 32G, in the second pixel parts 32G, as the incident position of the light spot L is closer to the one end 30a in the X-axis direction, an incident light amount of the light spot L incident to the second pixel parts 32G increases, and according to this, intensities of charge signals (second electric signals) generated in the second pixel parts 32G also increase. The charge signals are referred to as $Dy_1$ to $Dy_M$.

The calculation unit 65 calculates the first detection position PA1 by using the charge signals $Dx_1$ to $Dx_N$, and calculates the second detection position PB1 by using the charge signals $Dy_1$ to $Dy_M$. In addition, the calculation unit 65 performs weighting on the second detection position PB1 by using a variation of the intensifies of the charge signals $Dx_1$ to $DX_N$ with respect to the incident position of the light spot L in the Y-axis direction. In addition, the calculation unit 65 performs weighting on the first detection position PA1 by using a variation of the intensities of the charge signals $Dy_1$ to $Dy_M$ with respect to the incident position of the light spot L in the X-axis direction. Even in this aspect, it is possible to obtain the same effect as in the embodiment.

The position detection sensor of the present disclosure is not limited to the above-described embodiment and examples, and various modifications can be made. For example, the above-described embodiment and modification examples may be combined in correspondence with an object and an effect which are required.

REFERENCE SIGNS LIST 1, 1D: position detection sensor, 10, 10A to 10G: light-receiving unit, 20, 20A to 20F: first pixel pair group, 20G: first pixel group, 20a, 30a: one end, 20b, 30b: another end, 21, 21B to 21F: first pixel pair, 22, 22B to 22G: first pixel part, 22a, 23a, 32a, 33a: one portion, 22d to 22g: first pixel, 23, 23B to 23F, 32G: second pixel part, 23d to 23f, 32g: second. pixel, 24: first transmission filter, 25: second transmission filter, 26: first light-shielding part, 27: second light-shielding part, 28: first amplifier, 29: second amplifier, 30, 30A to 30F: second pixel pair group, 30G: second pixel group, 31, 31B to 31F: second pixel pair, 32, 32B to 32F: third pixel part, 32d to 32f: third pixel, 33, 33B to 33F: fourth pixel part, 33d to 33f: fourth pixel, 34: third transmission filter, 35: fourth transmission filter, 36: third light-shielding part, 37: four light-shielding part, 38: third amplifier, 39: fourth amplifier, 40, 40A, 40B: first signal processing unit, 41, 43, 44, 51, 53, 54: switch element, 42, 52: shift register, 50, 50A, 50B: second signal processing unit, 60, 60D: computation processing unit, 61, 62, 66 to 69: amplifier, 63, 64, 70 to 73: A/D converter, 65: calculation unit, $Dx_1$ to $Dx_N$, $Dy_1$ to $Dy_M$: charge signal, L, LA, LB: light spot, $Px_1$ to $Px_N$, $Py_1$ to $Py_M$: pixel part.

The invention claimed is:

1. A position detection sensor that detects an incident position of light, comprising:
   a first pixel pair group that includes a plurality of first pixel pairs arranged along a first direction, each of the first pixel pairs including a first pixel part that generates a first electric signal corresponding to an incident light amount of the light and a second pixel part that is disposed side by side with the first pixel part in the first direction and generates a second electric signal corresponding to an incident light amount of the light;
   a second pixel pair group that includes a plurality of second pixel pairs arranged along a second direction, each of the second pixel pairs including a third pixel part that generates a third electric signal corresponding to an incident light amount of the light and a fourth pixel part that is disposed side by side with the third pixel part in the second direction intersecting the first direction and generates a fourth electric signal corresponding to an incident light amount of the light, and the second pixel pair group intersecting the first pixel pair group; and
   a calculation unit that performs center-of-gravity operation by using the first electric signal and the second electric signal to calculate a first position that is the incident position in the first direction, and performs center-of-gravity operation by using the third electric signal and the fourth electric signal to calculate a second position that is the incident position in the second direction,
   wherein in the first pixel part, as the incident position is closer to a first end of the first pixel pair group in the second direction, an intensity of the first electric signal decreases,
   in the second pixel part, as the incident position is closer to the first end in the second direction, an intensity of the second electric signal increases,
   in the third pixel part, as the incident position is closer to a second end of the second pixel pair group in the first direction, an intensity of the third electric signal decreases,
   in the fourth pixel part, as the incident position is closer to the second end in the first direction, an intensity of the fourth electric signal increases, and
   the calculation unit performs weighting on the first position on the basis of the intensity of the third electric signal and the intensity of the fourth electric signal, and performs weighting on the second position on the basis of the intensity of the first electric signal and the intensity of the second electric signal.

2. The position detection sensor according to claim 1, wherein the first pixel pair group further includes a first transmission filter which covers the first pixel part and through which the light is transmitted, and a second transmission filter which covers the second pixel part and through which the light is transmitted,
   the second pixel pair group further includes a third transmission filter which covers the third pixel part and through which the light is transmitted, and a fourth transmission filter which covers the fourth pixel part and through which the light is transmitted,
   a transmittance of the light in the first transmission filter decreases as it is closer to the first end in the second direction,
   a transmittance of the light in the second transmission filter increases as it is closer to the first end in the second direction,
   a transmittance of the light in the third transmission filter decreases as it is closer to the second end in the first direction, and
   a transmittance of the light in the fourth transmission filter increases as it is closer to the second end in the first direction.

3. The position detection sensor according to claim 1, wherein the first pixel pair group further includes a first light-shielding part that covers another portion of the first pixel part excluding one portion of the first pixel part and shields the light, and a second light-shielding part that covers another portion of the second pixel part excluding one portion of the second pixel part and shields the light,
   the second pixel pair group further includes a third light-shielding part that covers another portion of the third pixel part excluding one portion of the third pixel part and shields the light, and a fourth light-shielding part that covers another portion of the fourth pixel part excluding one portion of the fourth pixel part and shields the light,
   a width of the one portion of the first pixel part in the first direction decreases as it is closer to the first end in the second direction,
   a width of the one portion of the second pixel part in the first direction increases as it is closer to the first end in the second direction,
   a width of the one portion of the third pixel part in the second direction decreases as it is closer to the second end in the first direction, and
   a width of the one portion of the fourth pixel part in the second direction increases as it is closer to the second end in the first direction.

4. The position detection sensor according to claim 1, a width of the first pixel part in the first direction decreases as it is closer to the first end in the second direction,
   a width of the second pixel part in the first direction increases as it is closer to the first end in the second direction,
   a width of the third pixel part in the second direction decreases as it is closer to the second end in the first direction, and
   a width of the fourth pixel part in the second direction increases as it is closer to the second end in the first direction.

5. The position detection sensor according to claim 1, wherein the first pixel part includes a plurality of first pixels arranged along the second direction,
   the second pixel part includes a plurality of second pixels arranged along the second direction, the third pixel part includes a plurality of third pixels arranged along the first direction, the fourth pixel part includes a plurality of fourth pixels arranged along the first direction, a width of the first pixels in the first direction is smaller as the first pixels are closer to the first end in the second direction, a width of the second pixels in the first direction is larger as the second pixels are closer to the first end in the second direction, a width of the third pixels in the second direction is smaller as the third pixels are closer to the second end in the first direction, and a width of the fourth pixels in the second direction is larger as the fourth pixels are closer to the second end in the first direction.

6. The position detection sensor according to claim 1, wherein the first pixel part includes a plurality of first pixels arranged along the second direction, the second pixel part includes a plurality of second pixels arranged along the second direction, the third pixel part includes a plurality of third pixels arranged along the first direction, the fourth pixel part includes a plurality of fourth pixels arranged along the first direction, the first pixel part includes a plurality of first amplifiers which are electrically connected to the plurality of first pixels and amplify intensities of electric signals generated in the plurality of first pixels, the second pixel part includes a plurality of second amplifiers which are electrically connected to the plurality of second pixels, and amplify intensities of electric signals generated in the plurality of second pixels, the third pixel part includes a plurality of third amplifiers which are electrically connected to the plurality of third pixels, and amplify intensities of electric signals generated in the plurality of third pixels, the fourth pixel part includes a plurality of fourth amplifiers which are electrically connected to the plurality of fourth pixels, and amplify intensities of electric signals generated in the plurality of fourth pixels, an amplification rate of the first amplifiers is smaller as the first pixels electrically connected to the first amplifiers are closer to the first end in the second direction, an amplification rate of the second amplifiers is larger as the second pixels electrically connected to the second amplifiers are closer to the first end in the second direction, an amplification rate of the third amplifiers is smaller as the third pixels electrically connected to the third amplifiers are closer to the second end in the first direction, and an amplification rate of the fourth amplifiers is larger as the fourth pixels electrically connected to the fourth amplifiers are closer to the second end in the first direction.

7. A position detection sensor that detects an incident position of light, comprising:

a first pixel group that includes a plurality of first pixel parts which are arranged along a first direction and generate a first electric signal corresponding to an incident light amount of the light;

a second pixel group that includes a plurality of second pixel parts which are arranged along a second direction intersecting the first direction and generate a second electric signal corresponding to an incident light amount of the light, the second pixel group intersecting the first pixel group; and a calculation unit that performs center-of-gravity operation by using the first electric signal to calculate a first position that is the incident position in the first direction, and performs center-of-gravity operation by using the second electric signal to calculate a second position that is the incident position in the second direction, wherein in the first pixel part, as the incident position is closer to a first end of the first pixel group in the second direction, an intensity of the first electric signal decreases, in the second pixel part, as the incident position is closer to a second end of the second pixel group in the first direction, an intensity of the second electric signal decreases, and the calculation unit performs weighting on the first position by using the intensity of the second electric signal, and performs weighting on the second position by using the intensity of the first electric signal.

* * * * *